(12) United States Patent
Chang et al.

(10) Patent No.: US 10,095,116 B2
(45) Date of Patent: Oct. 9, 2018

(54) LITHOGRAPHY SYSTEM AND LITHOGRAPHY METHOD FOR IMPROVING IMAGE CONTRAST

(71) Applicant: Taiwan Semiconductor Manufacturing Co., Ltd., Hsin-Chu (TW)

(72) Inventors: Shih-Ming Chang, Hsinchu County (TW); Wen Lo, Hsin-Chu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 38 days.

(21) Appl. No.: 15/378,442

(22) Filed: Dec. 14, 2016

(65) Prior Publication Data

US 2018/0164688 A1 Jun. 14, 2018

(51) Int. Cl.
*G03F 7/20* (2006.01)

(52) U.S. Cl.
CPC ........ *G03F 7/2059* (2013.01); *G03F 7/70625* (2013.01)

(58) Field of Classification Search
CPC ........................... G03F 7/2059; G03F 7/70625
USPC .......................................... 430/30, 296, 942
See application file for complete search history.

(56) References Cited

U.S. PATENT DOCUMENTS

| 4,264,711 | A | 4/1981 | Greeneich |
| 5,393,987 | A | 2/1995 | Abboud et al. |
| 6,316,164 | B1 | 11/2001 | Parker et al. |
| 6,361,911 | B1 | 3/2002 | Tsai et al. |
| 7,053,388 | B2 | 5/2006 | Crosland et al. |
| 7,427,765 | B2 | 9/2008 | Buller et al. |
| 8,378,319 | B2 | 2/2013 | Krecinic et al. |
| 8,464,186 | B2 | 6/2013 | Wang et al. |
| 8,530,121 | B2 | 9/2013 | Wang et al. |
| 8,835,082 | B2 | 9/2014 | Chen et al. |
| 8,941,085 | B2 | 1/2015 | Kuo et al. |
| 8,977,991 | B2 | 3/2015 | Chen et al. |
| 2006/0243922 | A1 | 11/2006 | Aloni et al. |
| 2013/0082188 | A1 | 4/2013 | Bilberger et al. |
| 2014/0192334 | A1 | 7/2014 | Chen et al. |
| 2014/0342272 | A1 | 11/2014 | Lu et al. |

*Primary Examiner* — Christopher G Young
(74) *Attorney, Agent, or Firm* — Haynes and Boone, LLP

(57) ABSTRACT

Systems and methods are disclosed herein for enhancing lithography printability, and in particular, for enhancing image contrast. An exemplary method includes receiving an integrated circuit (IC) design layout and generating an exposure map based on the IC design layout. The IC design layout includes a target pattern to be formed on a workpiece, and the exposure map includes an exposure grid divided into dark pixels and bright pixels that combine to form the target pattern. The method further includes adjusting the exposure map to increase exposure dosage at edges of the target pattern. In some implementations, the adjusting includes locating an edge portion of the target pattern in the exposure map, where the edge portion has a corresponding bright pixel, and assigning exposure energy from at least one dark pixel to the corresponding bright pixel, thereby generating a modified exposure map.

20 Claims, 16 Drawing Sheets

LITHOGRAPHY SYSTEM AND LITHOGRAPHY METHOD FOR IMPROVING IMAGE CONTRAST

BACKGROUND

Integrated circuit (IC) design becomes more challenging as IC technologies continually progress towards smaller feature sizes, such as 32 nanometers, 28 nanometers, 20 nanometers, and below. For example, when fabricating IC devices, IC device performance is seriously influenced by lithography printability capability, which indicates how well a final wafer pattern formed on a wafer corresponds with a target pattern defined by an IC design layout. Various methods (such as immersion lithography, multiple patterning lithography, extreme ultraviolet (EUV) lithography, and charged particle beam lithography) have been introduced for enhancing lithography printability. In particular, charged particle beam lithography, which involves writing an IC pattern on a workpiece using a charged particle beam without a mask, can form IC features smaller than a resolution of light. However, scattering behavior of the charged particle beam as it scans the workpiece limits often results in final wafer patterns having poor image contrast. Accordingly, although existing lithography systems and lithography methods have been generally adequate for their intended purposes, they have not been entirely satisfactory in all respects

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
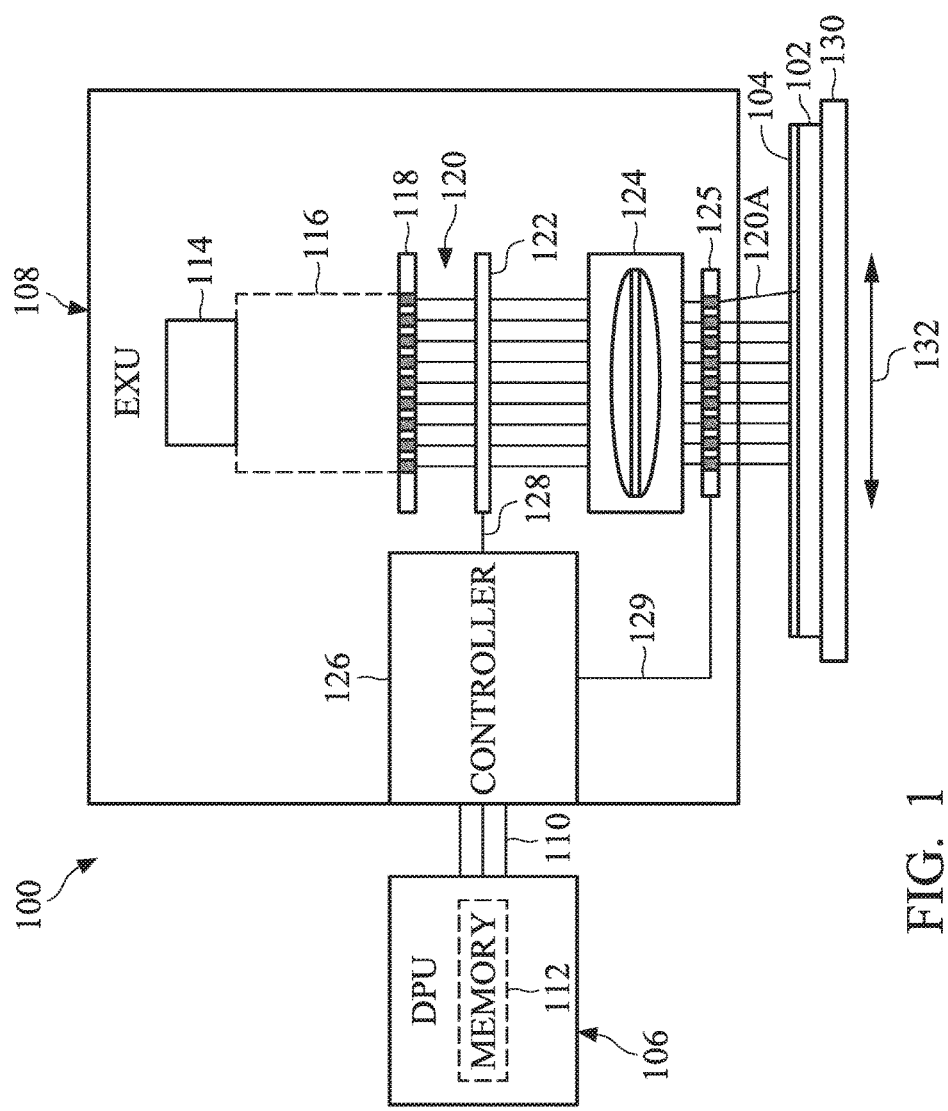
FIG. 1 is a simplified diagrammatic view of a charged particle beam system according to various aspects of the present disclosure.

The present disclosure relates generally to lithography systems and lithography methods, and more particularly, to lithography systems and lithography methods for enhancing image contrast.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

FIG. 1 is a simplified diagrammatic view of a charged particle beam system 100, according to various aspects of the present disclosure. Charged particle beam system 100 can implement methods described herein to write a pattern, such as an integrated circuit (IC) pattern, on a workpiece 102. Workpiece 102 includes a substrate (for example, a semiconductor substrate), a mask (also referred to as a photomask or a reticle), or any base material on which processing is conducted to produce layers of material configured to form IC patterns and/or IC features. In the depicted embodiment, a recording medium 104, such as a charged particle beam sensitive resist layer, is disposed on workpiece 102. Charged particle beam system 100 writes a pattern into recording medium 104, which is subsequently transferred to workpiece 102. FIG. 1 has been simplified for the sake of clarity to better understand the inventive concepts of the present disclosure. Additional features can be added in charged particle beam system 100, and some of the features described below can be modified, replaced, or eliminated for additional embodiments of charged particle beam system 100.

In FIG. 1, charged particle beam system 100 includes a charged particle beam data processing unit (DPU) 106 and a charged particle beam exposure unit (EXU) 108. DPU 106 is communicatively coupled with EXU 108 via communications link 110, such that DPU 106 and EXU 108 can communicate with one another. DPU 106 is configured to read patterning data from a data storage medium (for example, a non-volatile data storage medium), which may be within DPU 106, or remotely positioned and in communication with DPU 106. DPU 106 includes a memory 112, where DPU 106 loads patterning data obtained from the data storage memory into memory 112. In some implementations, the patterning data includes a pattern layout, such as an IC design layout. DPU 106 includes a pattern generator that processes the patterning data and generates a pattern writing instruction set, for example, a pattern writing instruction set associated with the pattern layout. DPU 106 sends the pattern writing instruction set to EXU 108, which controls and configures various components of EXU 108 to write the pattern corresponding with the pattern writing instruction set on workpiece 102. As described herein, DPU 106 is configured to generate pattern writing instructions that enhance image contrast, such that the pattern generator can process patterning data and generate a pattern writing instruction set that can be implemented by EXU 108 to form a pattern on workpiece 102 that exhibits enhanced image contrast.

EXU 108 includes a charged particle beam source 114 for generating a charged particle beam 116, such as a photon beam, an electron beam, or an ion beam. In some implementations, charged particle beam system 100 is an electron beam (e-beam) system, where charged particle beam source 114 generates an e-beam, such as an e-beam direct write (EBDW) system manufactured by IMS Nanofabrication AG (Vienna, Austria), KLA-Tencor Corp. (Milpitas, Calif.), or Leica Microsystems gmbH (Jenna, Germany). In some implementations, charged particle beam source 114 is an electron gun with an electron generating mechanism (for example, thermal electron emission). In a particular example, the electron gun includes a tungsten (or other suitable material) filament designed and biased to thermally emit electrons. Charged particle beam 116 is focused to be incident on a multi-beam mechanism 118 (such as a stencil plate), which generates a plurality of charged particle beams 120 from charged particle beam 116. For example, multi-beam mechanism 118 includes an aperture array for defining a shape and/or a distribution of charged particle beam 116. The aperture array can include various openings configured to generate an array of charged particle beams 120. In some implementations, charged particle beam 116 is incident on the aperture array as a large charged particle beam spot with a uniform space distribution, where the aperture array splits charged particle beam 116 into charged particle beams 120. In some implementations, the aperture array includes tunable openings, such that a size, shape, location, and/or other opening characteristic can be modified to achieve desired distribution of charged particle beams 120. The openings may be dynamically tunable over time. The number of charged particle beams 120 may vary depending on requirements of charged particle beam system 100, a charged particle beam lithography process, and/or an IC pattern to be formed on workpiece 102. In some implementations, as described further below, charged particle beams 120 are Gaussian beams (for example, circular beams having Gaussian current intensity distributions) scanned across workpiece 102 in a raster mode. Charged particle beam system 100 can include an imaging component, such as various electrostatic lenses and/or electromagnetic lenses, which focuses charged particle beam 116 onto multi-beam mechanism 118.

EXU 108 further includes a charged particle beam controller 122 that controls a shape and/or a distribution of charged particle beams 120 on workpiece 102 (in particular, on recording medium 104). In some implementations, an imaging component 124 (for example, an optical system that includes various electrostatic lenses and/or electromagnetic lenses) focuses charged particle beams 120 passing through charged particle beam controller 122 onto workpiece 102 to achieve desired imaging effect. Charged particle beam controller 122 includes a blanking system for turning charged particle beams 120 on or off (generally referred to as blanking), a deflection system for scanning charged particle beams 120 across workpiece 102 (for example, in a vector scan mode or a raster scan mode), and any other charged particle beam system components necessary to achieve desired distribution of charged particle beams 120 on workpiece 102. In some implementations, the blanking system includes at least one blanker and at least one aperture. For example, the blanker can include an electrostatic deflector (for example, a set of electrode plates) controlled by control signals (for example, electrical control signals) associated with pattern writing instructions received from DPU 106. When the electrostatic deflector is energized (for example, when a voltage is applied across the set of electrode plates), the blanker blocks charged particle beams 120 from passing through to workpiece 102 (for example, by sweeping charged particle beams off axis via an electrical field until the charged particle beam is intercepted by a downstream aperture). When the electrostatic deflector is not energized, the blanker allows charged particle beams 120 to pass through and expose a portion of workpiece 102. In some implementations, the blanking system can individually blank each charged particle beam 120. In some implementations, the deflection system includes a scanner that magnetically (for example, using conductive coils) or electrostatically (for example, using conductive plates) deflects charged particle beams 120 in two orthogonal directions, such that charged particle beams 120 are scanned over a surface of workpiece 100. In some implementations, the deflection system can individually deflect each charged particle beam 120. In some implementations, the deflection system includes a grid deflection system configured to deflect charged particle beam 140 across at least one pixel of an exposure grid, as described in detail below. For example, in FIG. 1, the deflection system includes a grid deflection system 125 disposed between imaging component 124 and workpiece 102. Grid deflection system 125 can individually deflect each charged particle beam 120, such that grid deflection system 125 can deflect one of charged particle beams 120 (for example, charged particle beam 120A) to a desired landing position on workpiece 102. In some implementations, grid deflection system 125 can deflect charged particle beams 120 to a landing position along an edge of a pattern to be formed on workpiece 102. In some implementations, the blanking system and the deflection system are integrated into a single module configured to blank and/or deflect charged particle beam 140. In some implementations, charged particle beam controller 122 blanks a portion of charged particle beams 120, such that grid deflection system 125 receives a remaining portion of charged particle beams 120, which can be deflected.

A control module 126 is integrated and communicatively coupled with various components of charged particle beam lithography system 100. In the depicted embodiment, control module 126 is communicatively coupled to DPU 106 and charged particle beam controller 122. Control module 126 sends electrical control signals via a communications link 128 to charged particle beam controller 122 and electrical control signals via a communications link 129 to grid deflection system 125 based on pattern writing instruction sets received from DPU 106, such that charged particle beam controller 122 configures the blanking system, the deflection system (including grid deflection system 125), and other components based on the electrical control signals received from control module 126.

A stage 130 holds and secures workpiece 102 thereon, for example, using a vacuum system and/or other suitable securing mechanism. During processing, stage 130 moves in various directions (depicted by arrow 132), such that charged particle beams 120 are incident on recording medium 104 on workpiece 102. Stage 130 and charged particle beam controller 122 (in particular, the blanking system and the deflection system) are configured to coordinately scan charged particle beams 120 across workpiece 102. Charged particle beams 120 are focused (for example, by imaging component 124) onto recording medium 104, such that a target pattern (for example, defined by the IC design layout) is written directly into recording medium 104 without using a mask. As described further below, charged particle beam system 100 is configured to directly write a target pattern with enhanced image contrast into recording medium 104 by increasing dosage at edge portions of the target pattern. Charged particle beam system 100 can achieve such enhanced image contrast with a single pass when operating in raster mode. After workpiece 102 has been scanned, a developing process is performed to remove exposed (or non-exposed) portions of recording medium 104, thereby forming a pattern in recording medium 104 that can be transferred to workpiece 102. For example, patterned recording medium 104 is used as a mask during a subsequent etching process, ion implantation process, or deposition process to form a patterned material layer of workpiece 102. The present disclosure contemplates that charged particle beam system 100 may include other components, such as an alignment system and/or a collimator. However, as noted above, charged particle beam system 100 is simplified for a better understanding of embodiments disclosed herein.

Figure 2:
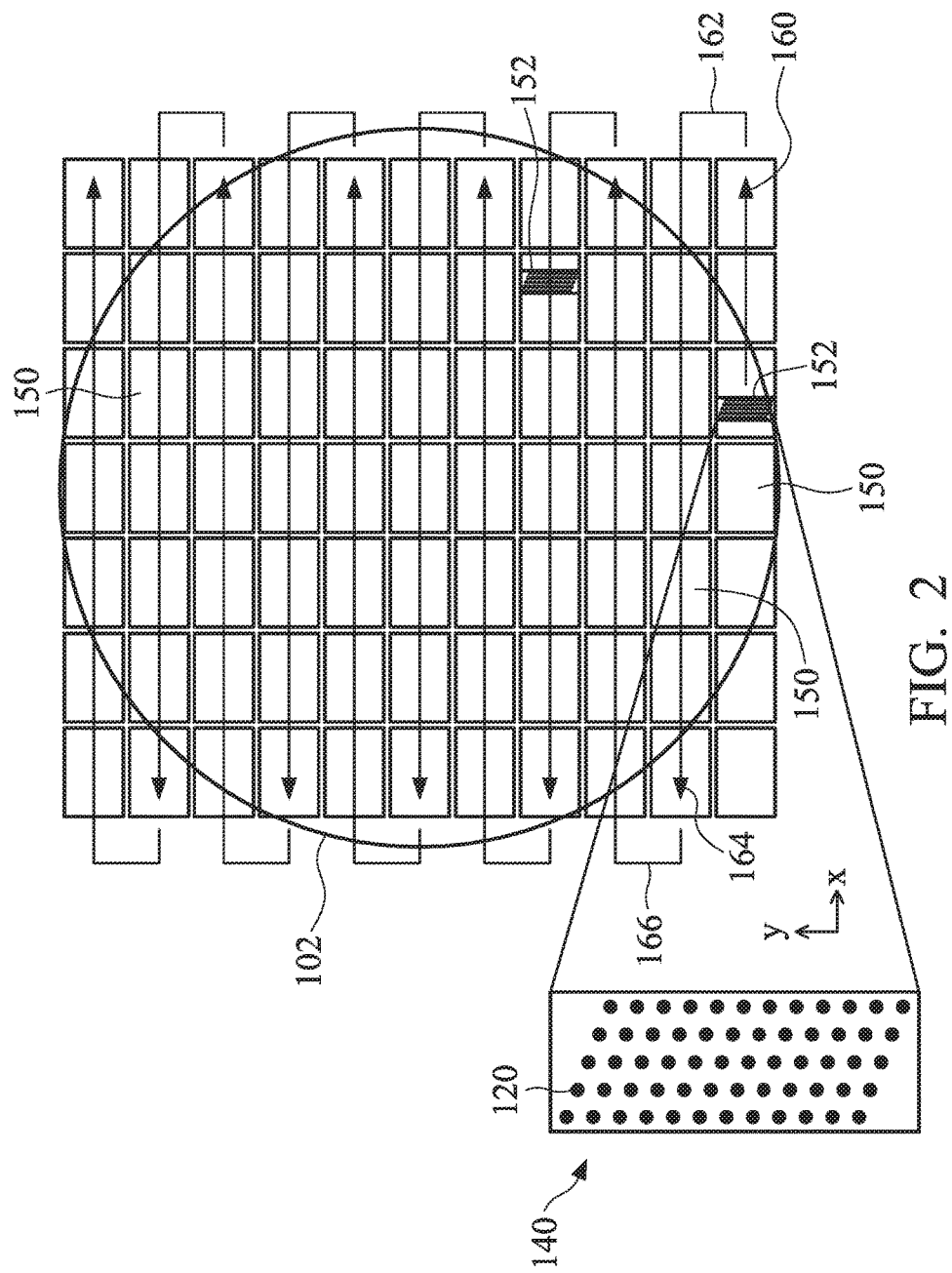
FIG. 2 is a simplified top view of a workpiece when raster scanning is implemented to perform a charged particle beam lithography process, such as that implemented by the charged particle beam system of FIG. 1, according to various aspects of the present disclosure.

Charged particle beam system 100 can implement vector scanning or raster scanning. For purposes of the following disclosure, charged particle beam system 100 is configured as a raster scan system (often referred to as a raster writer). FIG. 2 is a simplified diagrammatic top view of a workpiece, such as workpiece 102, when raster scanning is implemented for performing a charged particle beam lithography process according to various aspects of the present disclosure. In FIG. 2, a charged particle beam system, such as charged particle beam system 100, scans workpiece 102 with charged particle beams 120 (collectively referred to as a charged particle beam 140) along a scan direction. For example, in the depicted embodiment, charged particle beam 140 is scanned across workpiece 102 in an x-direction. Workpiece 102 is divided into exposure fields 150, each of which defines an area of workpiece 102 to be exposed by charged particle beam 140. During the charged particle beam lithography process, an IC pattern is transferred to workpiece 102 at locations (areas) corresponding with exposure fields 150. In some implementations, each exposure field 150 defines an area for forming at least one IC die, which is repeated over workpiece 102. In some implementations, exposure fields 150 define a maximum area that charged particle beam 140 can write without moving a stage, such as stage 130. In some implementations, each exposure field 150 is further divided into exposure sub-fields 152 of any suitable size, where exposure sub-fields 152 define an exposure area to which charged particle beam 140 will be confined during each exposure.

During raster scanning, charged particle beam system 100 scans charged particle beam 140 line by line across workpiece 102, blanking and/or deflecting charged particle beam 140 as required by an exposure map (pattern) defined by a pattern writing instruction set (for example, generated by DPU 106), such that entire workpiece 102 is scanned and directly written to by charged particle beam 140. For example, in the depicted embodiment, workpiece 102 moves (via stage 130) in a direction 160 along the x-direction, and the writing instructions (for example, blanking instructions and/or deflection instructions) control charged particle beam 140 to write a desired IC pattern to each exposure field 150. For a particular exposure field 150, charged particle beam system 100 positions charged particle beam at locations of particular exposure field 150 that correspond with each pixel defined in the exposure map. When charged particle beam 140 approaches an edge of workpiece 102, stage 130 continues to move until charged particle beam 140 scans beyond an edge of workpiece 102 a sufficient distance to facilitate a change in a direction 162, such as along the y-direction, to another row of exposure fields 150. Workpiece 102 is then moved in a direction 164 along the x-direction (opposite from direction 160) during exposure until charged particle beam 140 again reaches an edge of workpiece 102 and workpiece 102 is moved in a direction 166, such as along the y-direction, to position charged particle beam 140 along another row of exposure fields 150. Charged particle beam system 100 can repeat this process until the desired IC pattern is written in each exposure field 150 defined on workpiece 102. FIG. 2 has been simplified for the sake of clarity to better understand the inventive concepts of the present disclosure.

Figure 3:
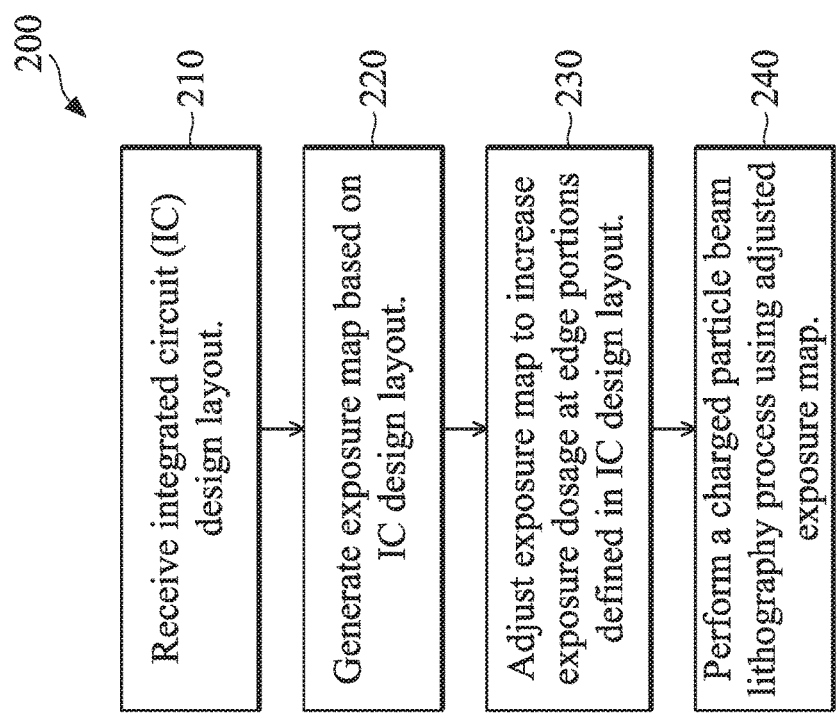
FIG. 3 is a flow chart of lithography method that can be implemented by a lithography system, such as the charged particle beam system of FIG. 1, according to various aspects of the present disclosure.

FIG. 3 is a flow chart of a lithography method 200, such as a charged particle beam lithography method, according to various aspects of the present disclosure. In some implementations, charged particle beam system 100 implements lithography method 200 to write a target pattern, such as an IC pattern, on a workpiece, such as workpiece 102, having a recording medium, such as recording medium 104, formed thereon. In some implementations, DPU 106 and/or EXU 108 perform various steps of lithography method 200. Lithography method 200 can be implemented by charged particle beam system 100 to write IC patterns with enhanced image contrast, for example, by increasing exposure dosage at edge portions of the IC patterns. Such image contrast enhancement is achieved without impacting throughput of charged particle beam system 100, allowing exposure dosage increases at edge portions using a single pass. FIG. 3 has been simplified for the sake of clarity to better understand the inventive concepts of the present disclosure. Additional steps can be provided before, during, and after lithography method 200, and some of the steps described can be modified, replaced, or eliminated for other embodiments of lithography method 200.

At block 210, an IC design layout for a target pattern is received, for example, to be formed on a workpiece, such as workpiece 102, by a lithography system, such as charged particle beam system 100. In some implementations, DPU 106 receives the IC design layout from a design house. The IC design layout is presented in one or more data files having information of the target pattern. For example, the IC design layout is received in a Graphic Database System file format (such as GDS or GDSII), an Open Artwork System Interchange Standard file format (such as OASIS or OAS), or other suitable file format. The IC design layout includes various circuit patterns (represented by geometrical shapes) designed for an IC product based on specifications of an IC product to be manufactured. The circuit patterns correspond to geometrical patterns formed in various material layers (such as metal layers, dielectric layers, and/or semiconductor layers) that combine to form IC features of the IC product, such as that to be fabricated on workpiece 102.

Figure 4:
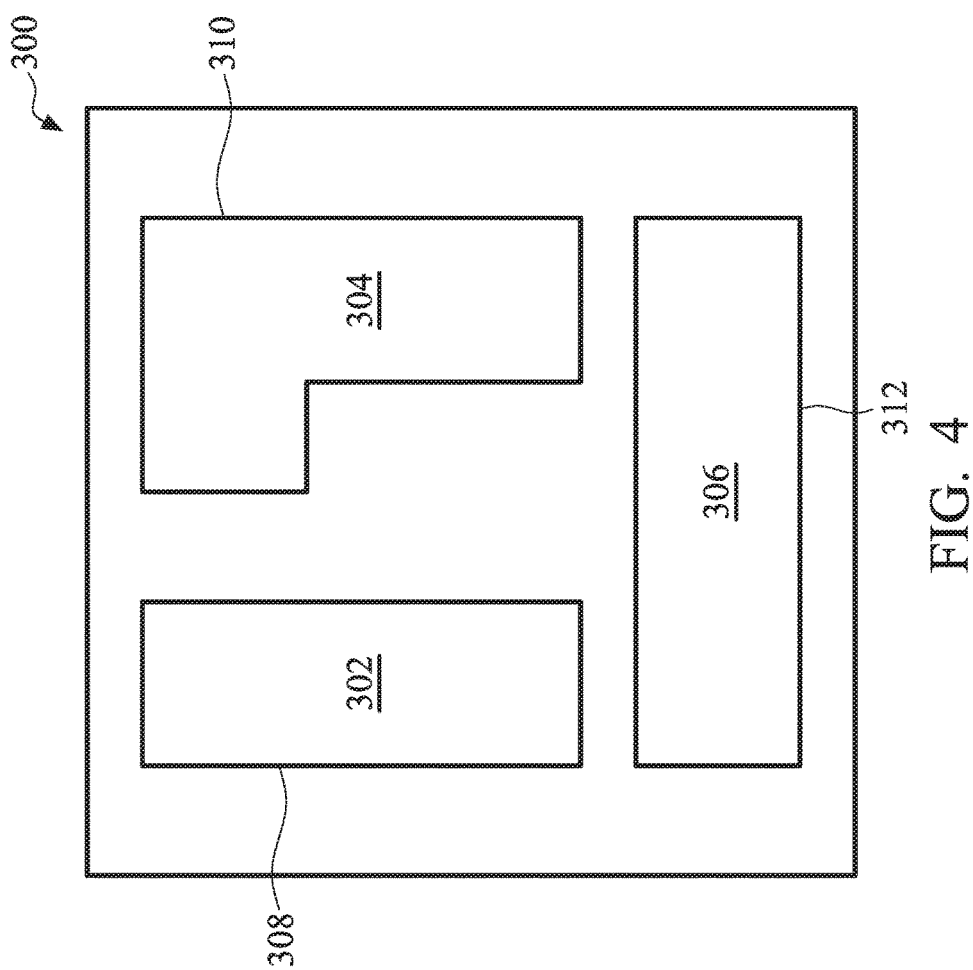
FIG. 4 is a schematic diagrammatic view of an IC design layout according to various aspects of the present disclosure.

FIG. 4 is a simplified diagrammatic view of an IC design layout 300 according to various aspects of the present disclosure. IC design layout 300 includes a target pattern defined by various geometrical patterns that represent IC features, such as an IC feature 302, an IC feature 304, and an IC feature 306. The IC features constitute a portion of an IC device that is to be formed or defined in a substrate (for example, a silicon substrate) and/or in various material layers disposed on the substrate. The IC features represent an active region/feature, a gate feature (for example, a gate electrode), a source region/feature and a drain region/feature, an interconnection feature, a bonding pad feature, other IC feature, or combinations thereof. IC design layout 300 can include assist features (not shown) for providing imaging effects, process enhancements, and/or identification information. IC feature 302, IC feature 304, and IC feature 306 are each defined by, respectively, a perimeter 308, a perimeter 310, and a perimeter 312. FIG. 4 has been simplified for the sake of clarity to better understand the inventive concepts of the present disclosure. Additional features can be added in IC design layout 300, and some of the features described above can be modified, replaced, or eliminated for additional embodiments of IC design layout 300.

Figure 5:
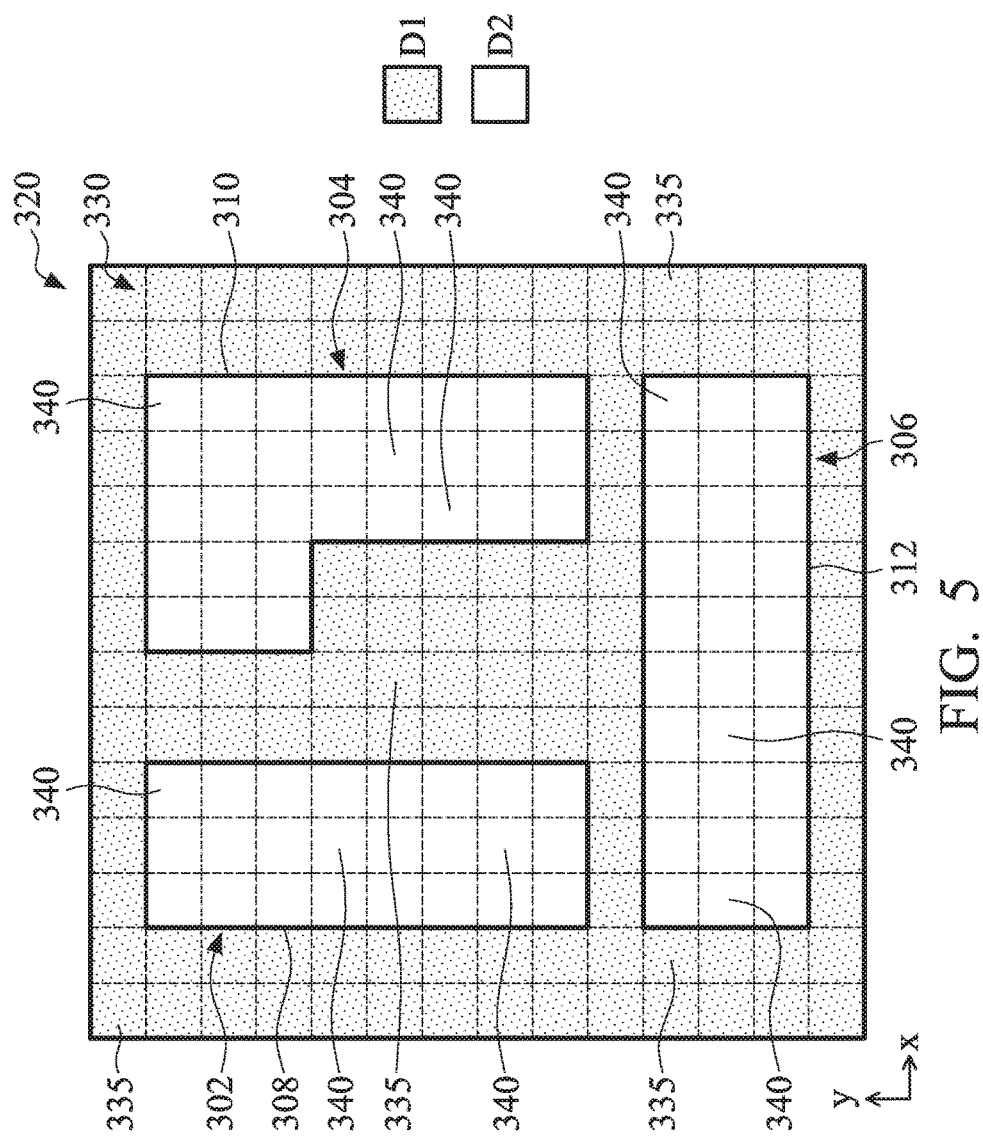
FIG. 5 is a simplified diagrammatic view of an exposure map according to various aspects of the present disclosure.

Turning again to FIG. 3, at block 220, an exposure map (layout) is generated based on the IC design layout, such as IC design layout 300. FIG. 5 is a simplified diagrammatic view of an exposure map 320 according to various aspects of the present disclosure. Exposure map 320 includes a target pattern, such as the target pattern (including IC feature 302, IC feature 304, and IC feature 306) defined by IC design layout 300. In some implementations, a pattern writing instruction set generated by DPU 106 defines exposure map 320, as further described below. Exposure map 320 includes an exposure grid 330 that defines exposure conditions for writing the target pattern onto a workpiece, such as workpiece 102. For example, exposure grid 330 includes a two-dimensional (2D) array of pixels arranged in a grid pattern having rows and columns, where each pixel has an exposure dosage (an amount of energy deposited per unit area) and a location address (corresponding to its coordinates within exposure grid 330). Each pixel of the 2D pixel array has a size, such as an area defined by a respective length and a respective width. In the depicted embodiment, pixels have the same shape and/or the same size, though the present disclosure contemplates embodiments where the pixels have varying shapes and/or sizes. In some implementations, each pixel represents a minimum resolution that can be achieved by an energy beam, such as charged particle beam 140. In some implementations, pixels are represented as dots or squares in a Cartesian coordinate system.

In some implementations, during a lithography process, charged particle beam system 100 scans each exposure field 150 based on exposure grid 330, such that the target pattern defined by IC design layout 300 is transferred to each exposure field 150. To transfer the target pattern onto an exposure field (such as exposure field 150), pixels are designated as dark pixels 335 or bright pixels 340. In the depicted embodiment, pixels outside perimeters of defined IC features (such as perimeter 308, perimeter 310, and perimeter 312 respectively of IC feature 302, IC feature 304, and IC feature 306) are designated as dark pixels 335, and pixels within perimeters of the defined IC features are designated as bright pixels 340. Dark pixels 335 are assigned an exposure dosage D1, and bright pixels 340 are assigned an exposure dosage D2, where exposure dosage D2 is greater than exposure dosage D1. In some implementations, exposure dosage D1 is a minimum intensity achievable by a lithography system (for example, achievable by charged particle beam system 100 blanking charged particle beam 140), and exposure dosage D2 is a maximum intensity achievable by the lithography system (for example, achievable by charged particle beam system 100 un-blanking charged particle beam 140). In some implementations, exposure dosage D1 is pre-defined exposure intensity, and exposure dosage D2 is any exposure intensity greater than the pre-defined exposure intensity.

A blanking instruction is generated for each pixel (for example, by DPU 106), such that EXU 108 can achieve each pixel's assigned exposure dosage (here, exposure dosage D1 or exposure dosage D2). The blanking instruction specifies whether an energy beam, such as charged particle beam 140, is blanked (turned off) or un-blanked (turned on). In the depicted embodiment, dark pixels 335 are assigned an OFF blanking instruction, and bright pixels 340 are assigned ON blanking instructions. Typically, charged particle beam system 100 would then implement the blanking instructions defined by exposure map 320 to scan each exposure field 150 pixel-by-pixel, blanking charged particle beam 140 when exposing workpiece 102 to dark pixels 335 and un-blanking charged particle beam 140 when exposing workpiece 102 to bright pixels 340, thereby transferring the target pattern defined by IC design layout 300 to each exposure field 150 of workpiece 102. Proximity effects that arise during the charged particle beam lithography process limit lithography resolution achievable by charged particle beam system 100 implementing exposure layout 320 as depicted in FIG. 5, causing undesirable variances between final wafer patterns on workpiece 102 and the target pattern defined by IC design layout 300. Proximity effects result from electrons that scatter as charged particle beam 140 passes through workpiece 102 (in particular, recording medium 104), such that an amount of exposure energy focused on a particular location of workpiece 102 varies from the exposure dosage defined in exposure map 320. In particular, locations of workpiece 102 exposed with bright pixels 340 that correspond with edge portions of the target pattern in IC design layout 300 (for example, bright pixels 340 near perimeter 308, perimeter 310, and perimeter 312) often receive less exposure energy than required for achieving exposure dosage D2, resulting in a final wafer pattern on workpiece 102 having poor image contrast.

Figure 6:
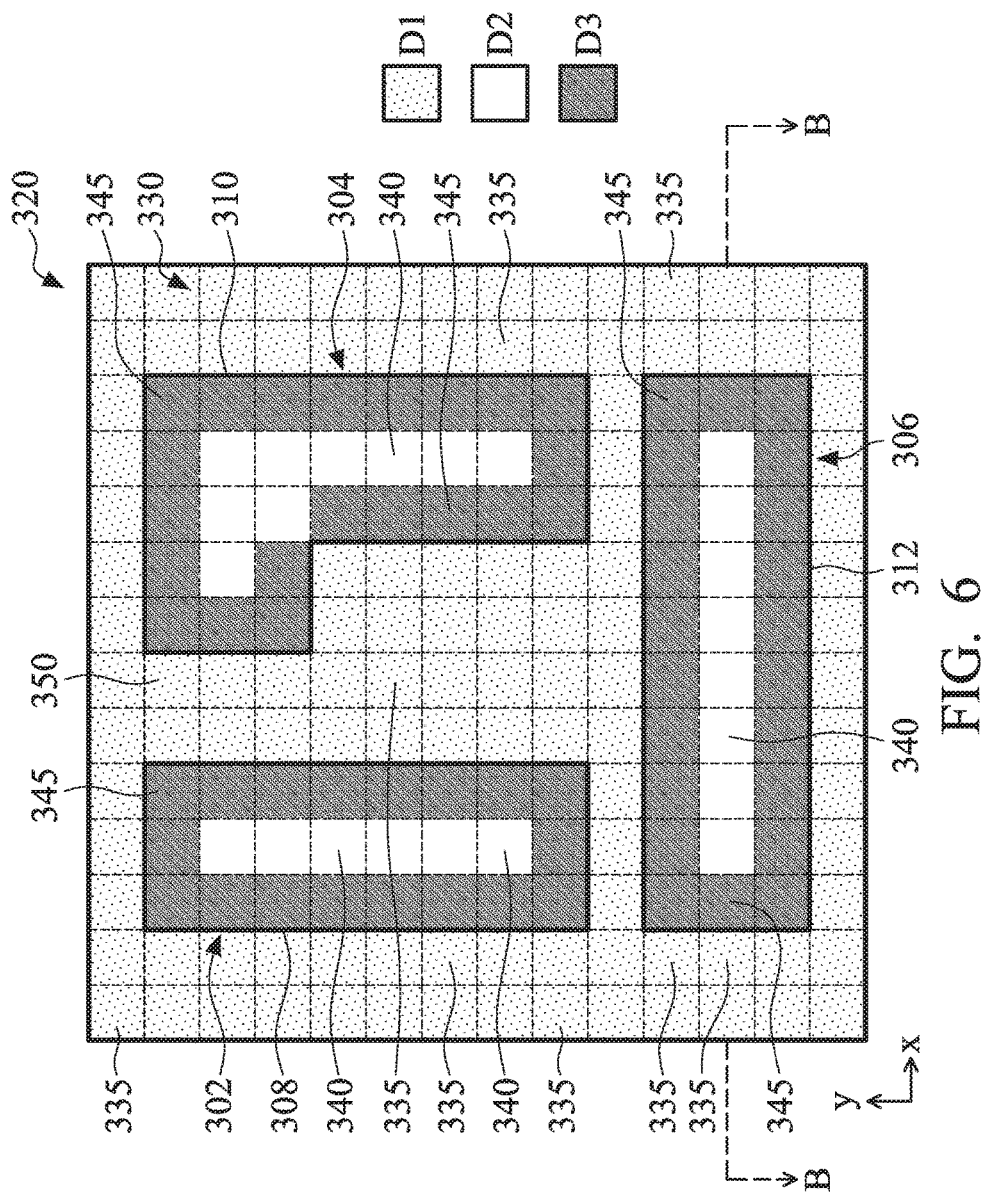
FIG. 6 is a simplified diagrammatic view of an exposure map, such as the exposure map of FIG. 5, adjusted to achieve enhanced image contrast according to various aspects of the present disclosure.
Figure 7:
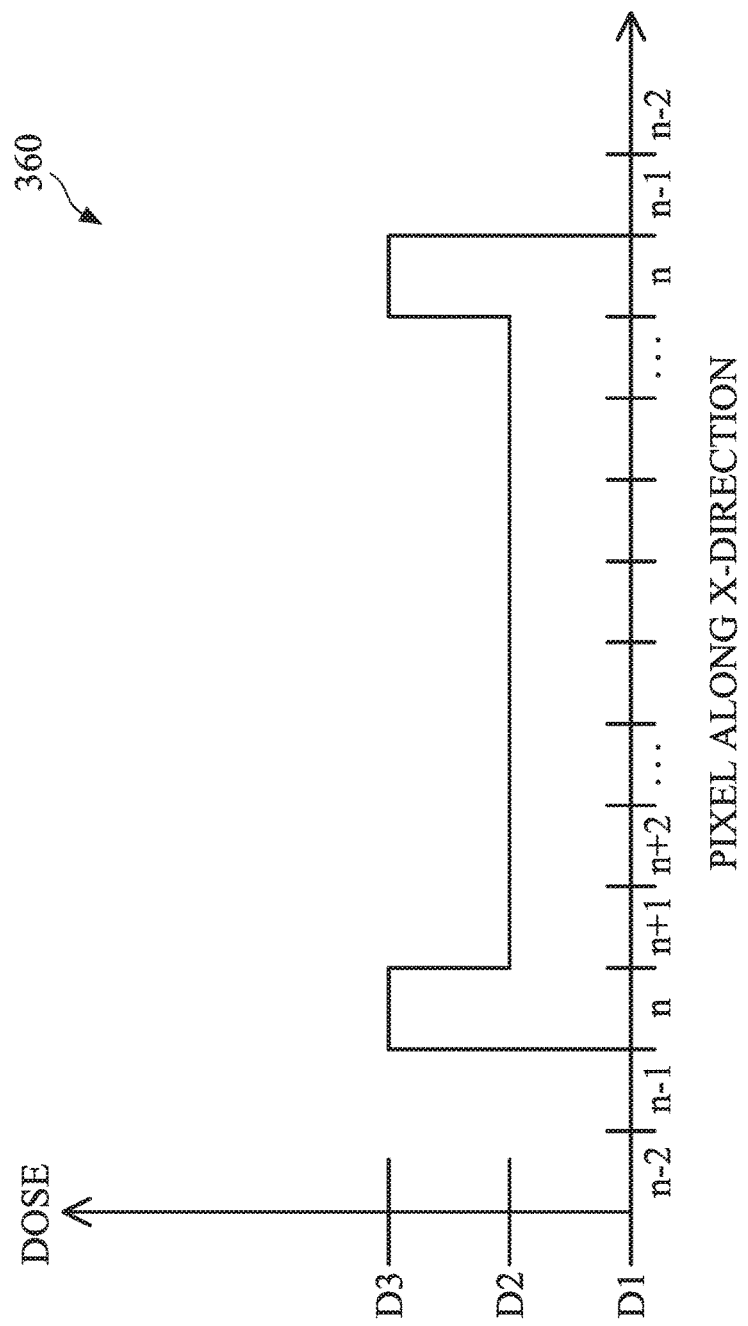
FIG. 7 diagrammatically illustrates a dosage profile of exposure map along line B-B in FIG. 6 according to various aspects of the present disclosure.

To remedy such effects, exposure dosage can be increased at the edge portions, such that exposure dosage received at edge portions of IC features defined in the IC design layout is greater than exposure dosage received inside the IC features. Turning again to FIG. 3, at block 230, the exposure map (layout) is adjusted to increase exposure dosage at edge portions defined in the IC design layout. For example, exposure dosage is increased at edge portions of IC feature 302, IC feature 304, and IC feature 306. FIG. 6 is a simplified diagrammatic view of exposure map 320 adjusted to achieve enhanced image contrast according to various aspects of the present disclosure. In FIG. 6, pixels in exposure grid 330 are further designated as bright edge pixels 345, which are assigned an exposure dosage D3 that is greater than exposure dosage D1 and exposure dosage D2. In some implementations, pixels within perimeters of the defined IC features (such as perimeter 308, perimeter 310, and perimeter 312 respectively of IC feature 302, IC feature 304, and IC feature 306) that have at least one neighboring dark pixel 335 are designated as bright edge pixels 345. In some implementations, pixels overlapping perimeters of the defined IC features that have at least one neighboring dark pixel 335 are designated as bright edge pixels 345. In some implementations, pixels overlapping perimeters of the defined IC features within a pre-defined overlap percentage or pre-defined overlap threshold are designated as bright edge pixels 345. In some implementations, bright edge pixels 345 are located by analyzing blanking instructions assigned to pixels at block 220. For example, DPU 106 can locate boundaries between ON blanking instructions and OFF blanking instructions, where bright pixels 340 associated with a boundary between an ON blanking instruction and an OFF blanking instruction are designated as bright edge pixels 345. FIG. 7 diagrammatically illustrates a dosage profile 360 of exposure map 320 along line B-B in FIG. 6 according to various aspects of the present disclosure. Dosage profile 360 is defined according to a horizontal axis that identifies a pixel in exposure map 320 along the x-direction and a vertical axis that indicates an exposure dosage for each identified pixel along the x-direction. In the dosage profile 360, bright edge pixels 345 are designated as n pixels, bright pixels 340 are identified as n+i (where i=1, 2, 3 . . . ), and dark pixels 335 are identified as n−j (where j=1, 2, 3 . . . ). As depicted, by increasing exposure dosage at bright edge pixels 345, dosage profile 360 increases image contrast and imaging resolution of the target pattern.

Since charged particle beam system 100 is configured for raster scanning, charged particle beam system 100 cannot independently tune charged particle beam 140 to achieve varying exposure dosages. For example, though charged particle beam system 100 can achieve exposure dosage D1 and exposure dosage D2 by blanking or un-blanking charged particle beam 140 during scanning, charged particle beam system 100 cannot stop and adjust charged particle beam 140 to expose bright edge pixels 345 with exposure dosage D3 during the scan. Typically, to achieve exposure dosage D3 (and thus increase exposure dosage at bright edge pixels 345), charged particle beam system 100 performs multiple scans. For example, in some implementations, charged particle beam system 100 performs a first scan on workpiece 102, where charged particle beam system 100 scans each exposure field 150 pixel-by-pixel, blanking charged particle beam 140 when exposing workpiece 102 to dark pixels 335 and un-blanking charged particle beam 140 when exposing workpiece 102 to bright pixels 340 and bright edge pixels 345. Then, charged particle beam system 100 performs a second scan on workpiece 102, where charged particle beam system 100 scans each exposure field 150 pixel-by-pixel, blanking charged particle beam 140 when exposing workpiece 102 to dark pixels 335 and bright pixels 340 and un-blanking charged particle beam 140 when exposing workpiece 102 to bright pixels 345. Though combining the first scan and the second scan achieves increased exposure dosage at edge portions of the target pattern (achieving, for example, dosage profile 360 depicted in FIG. 7), such multiple-scan process increases writing time, thereby decreasing throughput of charged particle beam system 100.

An alternative solution to achieving exposure dosage D3 at edge portions of the target pattern is to configure charged particle beam system 100 as a variable shaped beam (VSB) lithography system, which allows exposure intensity control, such that charged particle beam system 100 can configure charged particle beam 140 to expose workpiece 12 with exposure dosage D1, exposure dosage D2, and exposure dosage D3. However, VSB lithography systems achieve increased exposure dosage by increasing a dwell time (also referred to as a stay time) on pixels requiring the increased exposure dosage (such as bright edge pixels 345 requiring exposure dosage D3). This requires additional writing time, which also decreases throughput. Accordingly, when considering writing time necessary to achieve increased dosages for bright edge pixels 345, charged particle beam system 100 faces the same challenge whether configured as a VSB system or a raster scanning system—decreased throughput.

To overcomes such limitations, the present disclosure proposes a lithography system and a lithography method for increasing exposure dosage at edge portions of a target pattern defined by an IC design layout while maintaining (or even reducing) writing time, thereby enhancing image contrast without reducing throughput. As described below, a lithography system, such as charged particle beam system 100, "robs" exposure energy from dark pixels 335, directing exposure energy intended for dark pixels 335 to bright edge pixels 345. For example, instead of blanking an energy beam, such as charged particle beam 140, to prevent exposure energy from reaching workpiece 102 when exposing dark pixels 335, the lithography system selectively recycles this exposure energy to increase exposure time (and thus exposure energy) on bright edge pixels 345. By using exposure energy intended for dark pixels 335, the lithography system does not have to scan bright edge pixels 245 multiple times to increase exposure energy. Accordingly, the lithography system can achieve enhanced image contrast (by increasing exposure dosage at edges of the target pattern) by raster scanning workpiece 102. Such is achieved without reducing throughput of the lithography system, such as charged particle beam system 100. Different embodiments may have different advantages, and no particular advantage is necessarily required of any embodiment.

Figure 8:
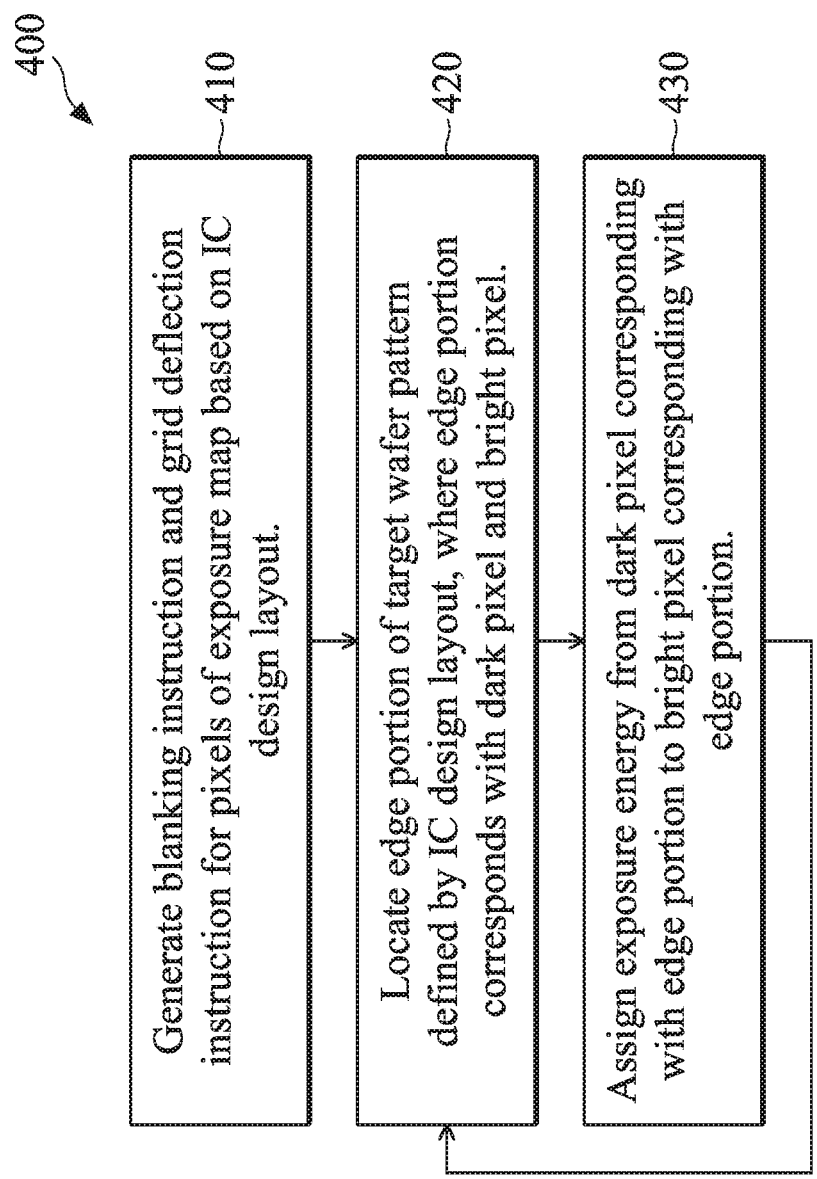
FIG. 8 is a flow chart of a method for enhancing image contrast that can be implemented by a lithography method, such as the lithography method of FIG. 2, according to various aspects of the present disclosure.

FIG. 8 is a flow chart of a method 400 for enhancing image contrast that can be implemented by a lithography method, such as at block 230 of lithography method 200 of FIG. 3, according to various aspects of the present disclosure. In some implementations, charged particle beam system 100 implements method 400. For example, DPU 106 and/or EXU 108 can perform various steps of method 400. Method 400 can be implemented by a lithography system, such as charged particle beam system 100, to write IC patterns with enhanced image contrast, for example, by increasing exposure dosage at edge portions of the IC patterns. Such image contrast enhancement is achieved without impacting throughput of lithography systems (such as charged particle beam system 100), allowing exposure dosage increases at edge portions of IC patterns in a single pass (scan). FIG. 8 has been simplified for the sake of clarity to better understand the inventive concepts of the present disclosure. Additional steps can be provided before, during, and after method 400, and some of the steps described can be modified, replaced, or eliminated for other embodiments of method 400.

At block 410, a blanking instruction and a grid deflection instruction are generated for pixels of an exposure map, such as exposure map 320, based on an IC design layout, such as IC design layout 300. The blanking instruction indicates whether an energy beam, such as charged particle beam 140, is turned on (un-blanked) or turned off (blanked) when exposing a given pixel. For example, an OFF blanking instruction directs charged particle beam system 100 to turn off (blank) charged particle beam 140 when exposing the given pixel, and an ON blanking instruction directs charged particle beam system 100 to turn on (un-blank) charged particle beam 140 when exposing the given pixel. The grid deflecting instruction indicates whether the energy beam, such as charged particle beam 140, is deflected to another pixel of an exposure grid, such as exposure grid 330, when exposing the given pixel. For example, an OFF grid deflecting instruction directs charged particle beam system 100 to not deflect exposure energy from charged particle beam 140 across exposure grid 330 when exposing the given pixel, and an ON grid deflecting instruction directs charged particle beam system 100 to deflect exposure energy from charged particle beam 140 across exposure grid 330 when exposing the given pixel. Referring to FIG. 5 and/or FIG. 6, by default, dark pixels 335 are assigned an ON blanking instruction and an OFF grid deflecting instruction, and bright pixels 340 (and bright edge pixels 345, if designated) are assigned an OFF blanking instruction and an OFF grid deflecting instruction. In some implementations, DPU 106 generates a blanking instruction and a grid deflecting instruction for each pixel of exposure grid 330. In some implementations, bright edge pixels 345 are not identified, and DPU 106 generates a blanking instruction and a grid deflecting instruction for dark pixels 335 and bright pixels 340 only. In some implementations, when blanking instructions are generated at block 220 of method 200, only grid deflecting instructions are generated at block 410.

Figure 9:
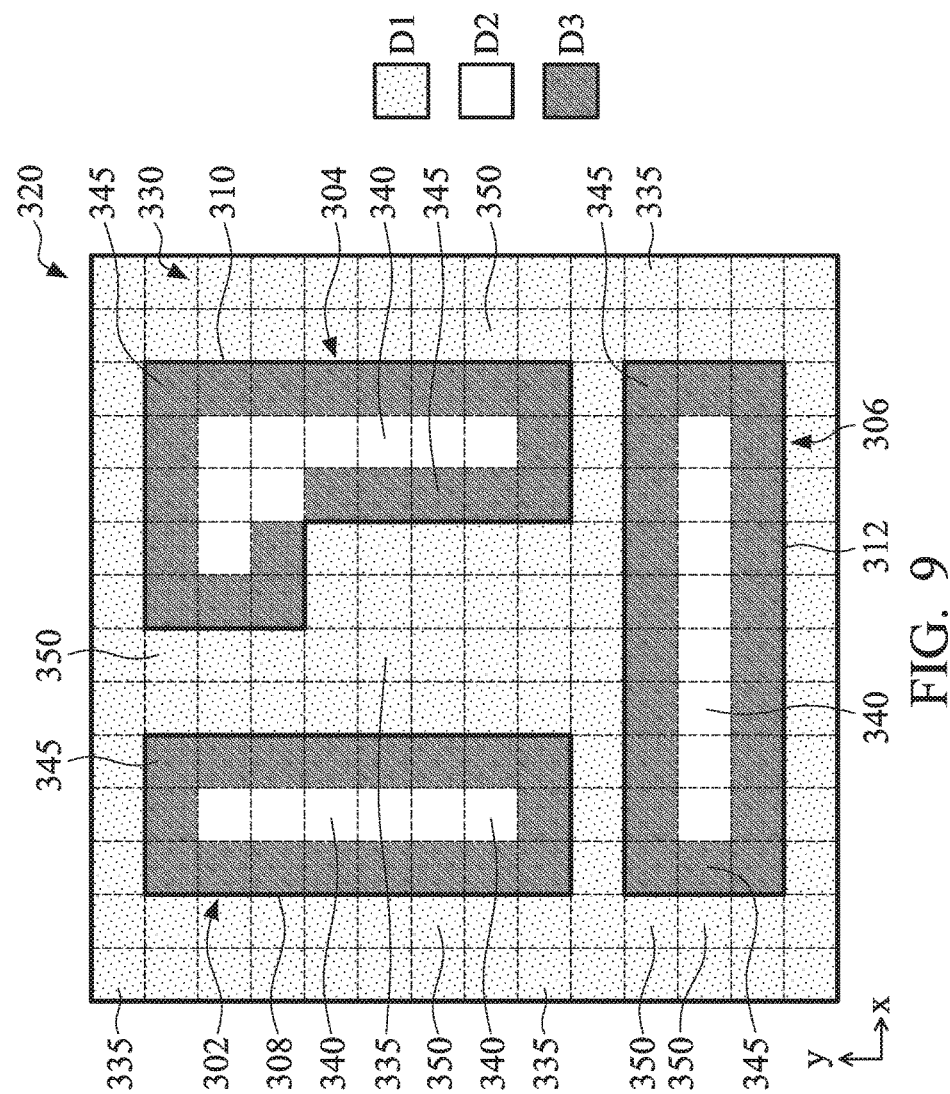
FIG. 9 is a simplified diagrammatic view of an exposure map, such as the exposure map of FIG. 6, further adjusted to achieve enhanced image contrast according to various aspects of the present disclosure.

At block 420, method 400 proceeds with locating an edge portion of a target pattern defined by the IC design layout, such as edge portions of IC feature 302, IC feature 304, and IC feature 306. The edge portion corresponds with a boundary between a dark pixel (such as one of dark pixels 335) and a bright pixel (such as one of bright pixels 340). Any process is implemented for locating edge portions of the target pattern, where the locating includes identifying bright pixels 340 having at least one neighboring dark pixel 335. In some implementations, referring to FIG. 6, bright edge pixels 345 are identified, and dark edge pixels 335 adjacent to bright edge pixels 345 are designated as neighboring dark edge pixels in exposure map 320. For example, FIG. 9 is a simplified diagrammatic view of exposure map 320 according to various aspects of the present disclosure, where dark pixels 335 adjacent to bright edge pixels 345 are designated as neighboring dark edge pixels 350. In some implementations, dark edge pixels 335 proximate to bright edge pixels 345 (such as dark pixels 335 that are two, three, or more pixels away from bright edge pixels 345) are designated as neighboring dark edge pixels 350. In some implementations, referring to FIG. 5 and/or FIG. 6, when a transition between a particular dark pixel 335 and a particular bright pixel 340 is located, particular bright pixel 340 is designated the edge portion (for example, by designating given bright pixel 340 as one of bright edge pixels 345). In some implementations, referring to FIG. 5 and/or FIG. 6, when a transition between an ON blanking instruction and an OFF blanking instruction is located, a pixel assigned the ON blanking instruction is designated the edge portion.

At block 430, exposure energy assigned to the dark pixel corresponding with the edge portion is assigned to the bright pixel corresponding with the edge portion. In some implementations, assigning the exposure energy is achieved by modifying (adjusting) a blanking instruction and a grid deflecting instruction for the dark pixel corresponding with the edge portion. For example, bright edge pixels 345 are assigned exposure energy from neighboring dark pixels 350. In some implementations, DPU 106 assigns neighboring dark pixels 350 an ON blanking instruction and an ON grid deflecting instruction (instead of original OFF blanking instruction and OFF grid deflecting instruction, which were assigned to dark pixels 335 by default at block 410), such that charged particle beam system 100 turns on charged particle beam 140 and deflects charged particle beam 140 to bright edge pixels 345 when exposing neighboring dark pixels 350. Accordingly, charged particle beam system 100 doubles exposure dosage for bright edge pixels 345 in a single pass (scan) by doubling dwell time of charged particle beam 140 on bright edge pixels 345. Charged particle beam system 100 thus "robs" extra time (or extra exposure dosage) for bright edge pixels 345 from neighboring dark pixels 350, deflecting exposure energy from off grid (neighboring dark pixels 350) to on grid (bright edge pixels 345). In some implementations, when dark edge pixels 335 proximate to bright edge pixels 345 (such as dark pixels 335 that are two, three, or more pixels away from bright edge pixels 345) are designated as neighboring dark edge pixels 350, charged particle beam 100 can multiply exposure dosage for bright edge pixels 345 even further, achieving exposure dosage two, three, or even four times greater than exposure intensity of charged particle beam 140.

Turning again to FIG. 3, method 200 can continue at block 240, where a lithography process is performed using the adjusted exposure map. For example, charged particle beam system 100 performs a charged particle beam lithography process on workpiece 102 as described herein. Charged particle beam system 100 can implement the image contrast enhancement techniques described above when scanning workpiece 102 in any direction relative to edges of a target pattern defined by an IC design layout (for example, parallel to, perpendicular to, or at oblique angles to (such as 45°).

Turning to FIGS. 10A-10F, charged particle beam system 100 can implement the image contrast enhancement techniques described above when scanning workpiece 102 perpendicular to edges of a target pattern defined by an IC design layout. FIGS. 10A-10F schematically depict an energy beam, such as charged particle beam 140, scanned across a workpiece to achieve a dosage profile 500 that includes multiple exposure dosages according to various aspects of the present disclosure. Dosage profile 500 defines exposure dosages for pixels along a scan direction, where a horizontal axis identifies a location of each pixel (such as an x-coordinate) along the scan direction and a vertical axis indicates an exposure dosage for each identified pixel. In the depicted embodiment, identified pixels include dark pixels 335, bright pixels 340, bright edge pixels 345, and neighboring dark edge pixels 350. Each pixel corresponds with a number of exposure blocks 502, where each exposure block 502 represents a unit of exposure dose. For example, exposure dosage D1 is assigned to edge pixels 335 and neighboring dark edge pixels 350 (represented by no exposure blocks 502), exposure dosage D2 is assigned to bright pixels 340 (represented by one exposure block 502), and exposure dosage D3 is assigned to bright edge pixels 345 (represented by two exposure blocks 502). Exposure dosage D3 is greater than exposure dosage D2, and exposure dosage D2 is greater than exposure dosage D1. As noted, stage movement as depicted by arrow 510 (or beam movement as depicted by arrow 512) is perpendicular to edges of the target pattern, such as perpendicular to a boundary of neighboring dark edge pixels 350 and bright edge pixels 345.

In FIGS. 10A-10F, charged particle beam system 100 scans workpiece 102 pixel-by-pixel, blanking and deflecting charged particle beam 140 based on dosage profile 500. Charged particle beam system 100 increases exposure dosage at edges of the target pattern (defined by bright edge pixels 345) by robbing exposure energy from neighboring dark pixels 350 for bright edge pixels 345, thereby enhancing image contrast without reducing throughput. Such is achieved by un-blanking and deflecting charged particle beam 140 when positioned at a location that corresponds with a dark pixel directly before or after bright edge pixels 345 (here, neighboring dark edge pixels 350). By robbing exposure energy from dark pixels along the scan direction, charged particle beam system 100 can increase exposure dosage at edges of the target pattern in a single pass over the pixels identified in dosage profile 500. Though the depicted embodiment illustrates un-blanking and deflecting only neighboring dark edge pixels 350, the present disclosure contemplates embodiments where charged particle beam system 100 un-blanks and deflects charged particle beam 140 when positioned at any location that corresponds with any dark pixel 335, such that bright edge pixels 345 receive additional exposure energy from any dark pixels defined in the exposure layout.

Figure 10B:
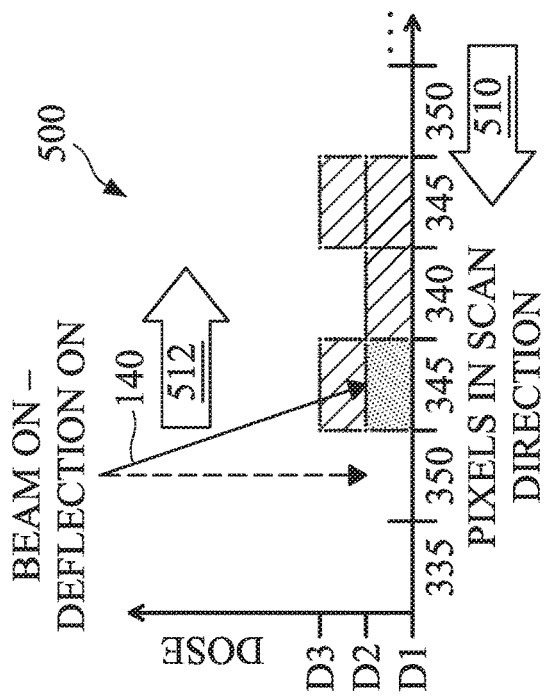
FIGS. 10A-10F schematically depict an energy beam scanned across a workpiece to achieve a dosage profile that includes multiple exposure dosages according to various aspects of the present disclosure.
Figure 10A:
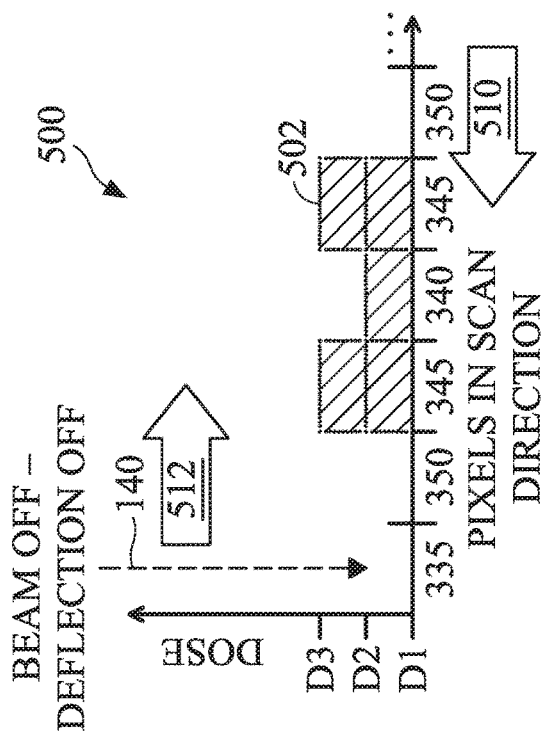
Figure 10C:
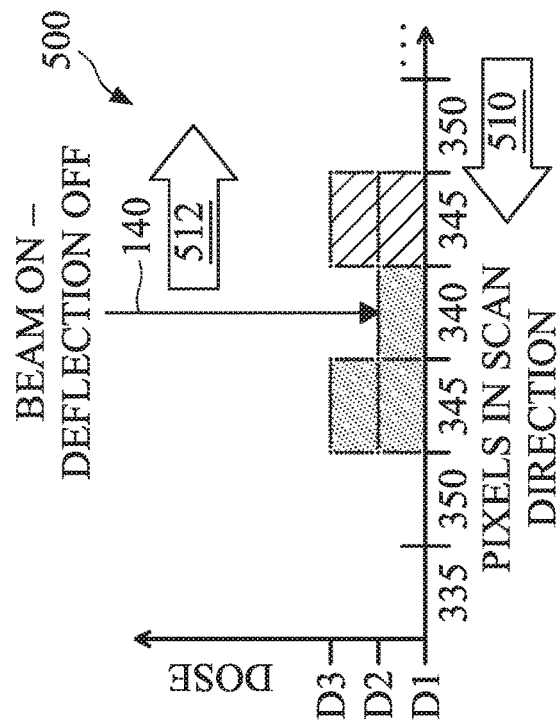

In FIG. 10A, charged particle beam 140 is positioned at a location that corresponds with dark pixel 335, and charged particle beam system 100 blanks charged particle beam 140 (as depicted by a dashed line) without deflection to expose dark pixel 335 on workpiece 102, such that dark pixel 335 receive exposure dosage D1. In FIG. 10B, charged particle beam 140 is positioned at a location that corresponds with neighboring dark pixel 350, and charged particle beam system 100 un-blanks (as depicted by a solid line) and deflects charged particle beam 140 to expose neighboring dark pixel 350 on workpiece 102, such that neighboring dark pixel 350 receives exposure dosage D1 and bright edge pixel 345 receives exposure dosage D2. In such implementations, charged particle beam system 100 deflects charged particle beam 140 forward one pixel to cross a boundary between neighboring dark pixel 350 and bright edge pixel 345 (in other words, charged particle beam 140 is deflected forward at least one pixel of an exposure grid to cross a dark-bright boundary). In FIG. 10C, charged particle beam 140 is positioned at a location that corresponds with bright edge pixel 345, and charged particle beam system 100 un-blanks charged particle beam 140 without deflection to expose bright edge pixel 345 on workpiece 102. Bright edge pixel 345 is thus exposed again to charged particle beam 140, such that bright edge pixel 345 receives exposure dosage D3. By robbing exposure energy from neighboring dark pixel 350 (in FIG. 10B), charged particle beam system 100 doubles exposure time (and exposure energy) received by bright edge pixel 345.

Figure 10D:
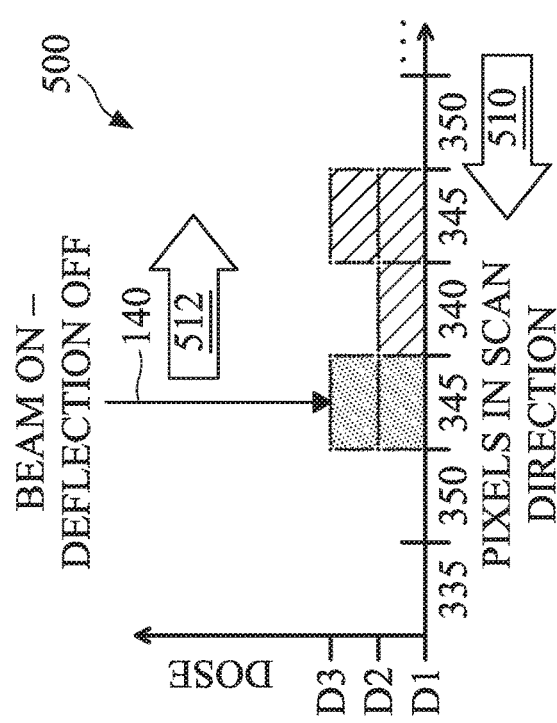
Figure 10F:
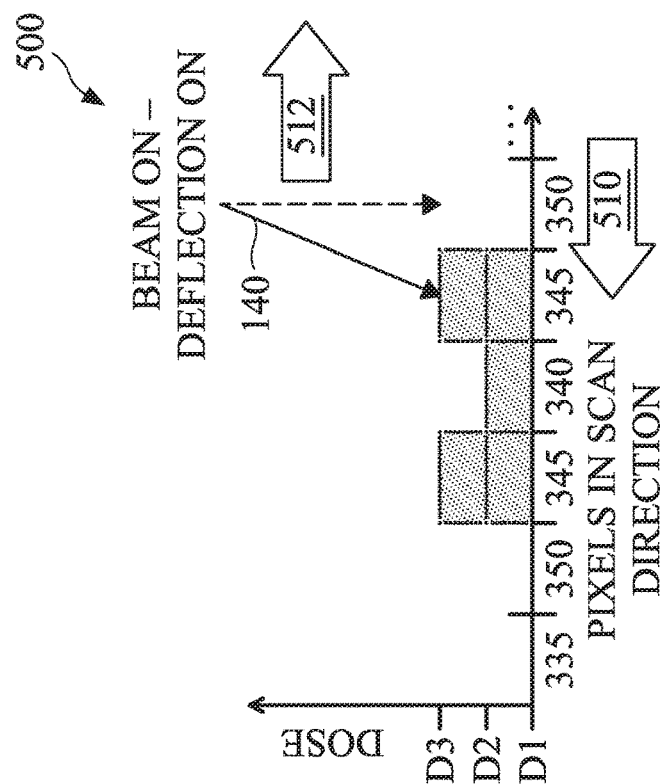
Figure 10E:
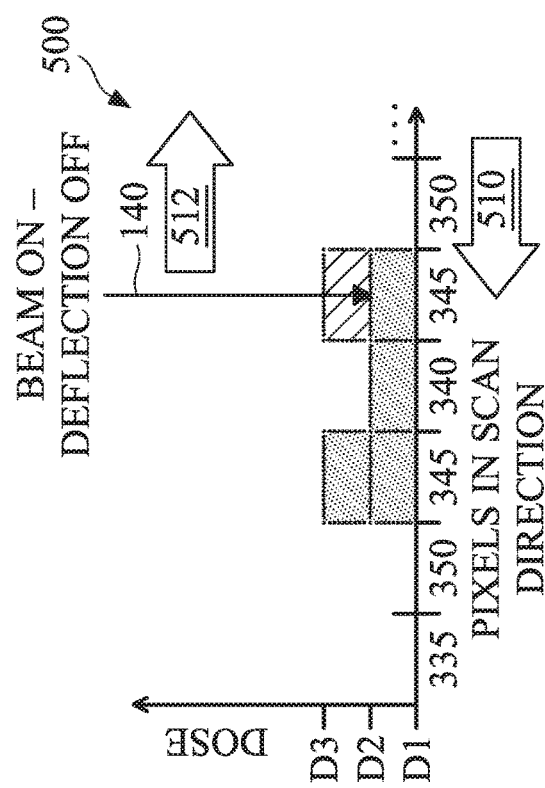

In FIG. 10D, charged particle beam 140 is positioned at a location that corresponds with bright pixel 340, and charged particle beam system 100 un-blanks charged particle beam 140 without deflection to expose bright pixel 340 on workpiece 102, such that bright pixel 340 receives exposure dosage D2. In FIG. 10E, charged particle beam 140 is positioned at a location that corresponds with bright edge pixel 345, and charged particle beam system 100 un-blanks charged particle beam 140 without deflection to expose bright edge pixel 345 on workpiece 102, such that bright edge pixel 345 receives exposure dosage D2. In FIG. 10F, charged particle beam 140 is positioned at a location that corresponds with neighboring dark pixel 350, and charged particle beam system 100 un-blanks and deflects charged particle beam 140 to expose neighboring dark pixel 350 on workpiece 102, such that neighboring dark pixel 350 receives exposure dosage D1. In such implementations, charged particle beam system 100 deflects charged particle beam 140 backward one pixel to cross a boundary between neighboring dark pixel 350 and bright edge pixel 345 (in other words, charged particle beam 140 is deflected backwards at least one pixel of an exposure grid to cross a dark-bright boundary). Again, charged particle beam system 100 robs exposure energy from a neighboring dark edge pixel 350. Bright edge pixel 345 is thus exposed again to charged particle beam 140, such that bright edge pixel 345 receives exposure dosage D3. By robbing exposure energy from neighboring dark pixel 350 (in FIG. 10F), charged particle beam system 100 doubles exposure time (and exposure energy) received by bright edge pixel 345.

Turning to FIGS. 11A-11D, charged particle beam system 100 can implement the image contrast enhancement techniques described above when scanning workpiece 102 parallel to edges of a target pattern defined by an IC design layout. For example, FIGS. 11A-11D schematically depict an energy beam, such as charged particle beam 140, scanned across a workpiece to achieve a dosage profile 600 that includes multiple exposure dosages according to various aspects of the present disclosure. Dosage profile 600 defines exposure dosages for pixels of an exposure map, where a horizontal plane defined by an x-axis and a y-axis identifies a location of each pixel (such as an x-coordinate and a y-coordinate) and a vertical axis identifies an exposure dosage for each identified pixel. Each pixel corresponds with a number of exposure blocks 605, where each exposure block 605 represents a unit of exposure dose. In dosage profile 600, pixels are assigned exposure dosage D1, exposure dosage D2, exposure dosage D3, or exposure dosage D4. Exposure dosage D4 is greater than exposure dosage D3, exposure dosage D3 is greater than exposure dosage D2, and exposure dosage D2 is greater than exposure dosage D1. The assigned exposure dosages define edge portions of the target pattern. For example, in the depicted embodiment, pixels assigned exposure dosage D4 designate edge portions of the target pattern, which combine to form an edge of the target pattern.

In FIGS. 11A-11D, charged particle beam system 100 scans workpiece 102 pixel-by-pixel along scan lines 1-7, blanking and deflecting charged particle beam 140 based on dosage profile 600. Charged particle beam system 100 increases exposure dosage at edges of the target pattern (such as pixels assigned exposure dosage D4) by robbing exposure energy from pixels assigned a minimum exposure dosage (such as pixels assigned exposure dosage D1), thereby enhancing image contrast without reducing throughput. For example, when positioned at a location that corresponds with a pixel assigned exposure dosage D1 in a particular scan line, charged particle beam system 100 un-blanks and deflects charged particle beam 140 to a pixel assigned exposure dosage D4 in an adjacent scan line. By robbing exposure energy from pixels assigned exposure dosage D1 in nearby scan lines, charged particle beam system 100 can increase exposure dosage at edges of the target pattern in a single pass over the pixels identified in dosage profile 600. Though the depicted embodiment illustrates un-blanking and deflecting exposure energy only from pixels assigned exposure dosage D1 that are adjacent to pixels assigned exposure dosage D4, the present disclosure contemplates embodiments where charged particle beam system 100 un-blanks and deflects charged particle beam 140 when positioned at any location that corresponds with any pixel assigned exposure dosage D1, such that pixels assigned exposure dosage D4 receive additional exposure energy from any pixel assigned exposure dosage D1 in the exposure layout. In FIGS. 11A-11D, charged particle beam system 100 includes a grid deflection system 610 (for example, a set of electrostatic plates) that deflects charged particle beam 140 across at least one pixel of an exposure grid.

Figure 11B:
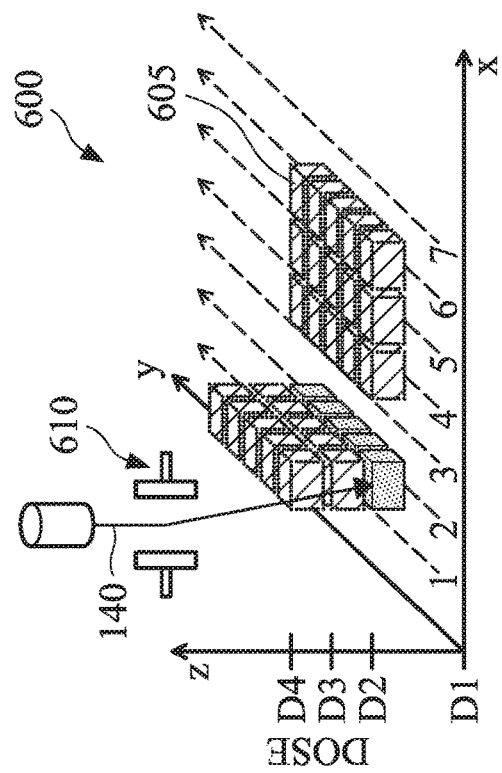
FIGS. 11A-11D schematically depict an energy beam scanned across a workpiece to achieve another dosage profile that includes multiple exposure dosages according to various aspects of the present disclosure.
Figure 11A:
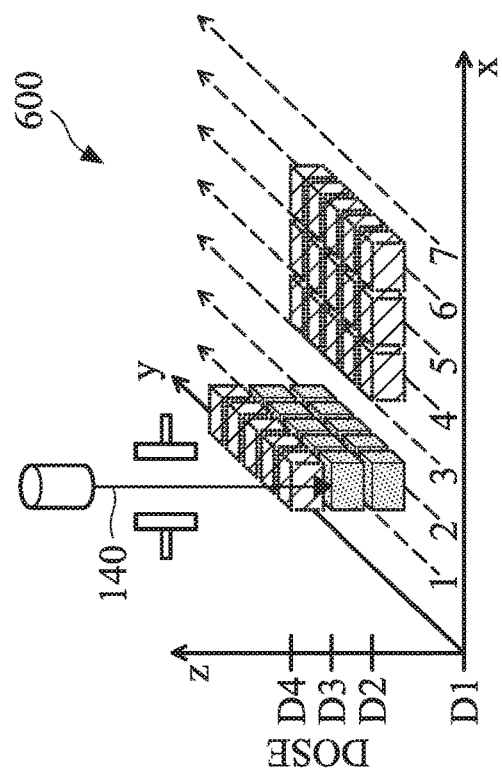

In FIG. 11A, charged particle beam 140 is scanned pixel-by-pixel along scan line 1, positioned at locations that correspond with pixels assigned exposure dosage D1. For pixels along scan line 1 that do not neighbor pixels assigned exposure dosage D4 (in other words, dark pixels 335), charged particle beam system 100 blanks charged particle beam 140 without deflection to expose these pixels on workpiece 102, such that these pixels receive exposure dosage D1. For pixels along scan line 1 that neighbor pixels assigned exposure dosage D4 (in other words, neighboring dark edge pixels 350), charged particle beam system 100 un-blanks and deflects charged particle beam 140 to expose these pixels on workpiece 102, such that these pixels receive exposure dosage D1 and pixels assigned exposure dosage D4 (in other words, bright edge pixels 345) receive exposure dosage D2. In such implementations, charged particle beam system 100 deflects charged particle beam 140 in a direction perpendicular to the scan direction. For example, in the depicted embodiment, charged particle beam 140 is scanned in the y-direction, and charged particle beam system 100 deflects charged particle beam 140 in the x-direction (here, right) one pixel to cross a boundary between pixels assigned exposure dosage D1 and pixels assigned exposure dosage D4. Accordingly, when scanning in a direction parallel to an edge of the target pattern (here, defined by a column of pixels assigned exposure dosage D4), charged particle beam system 100 robs exposure energy from a column of pixels in scan line 1 adjacent to the column of pixels assigned exposure dosage D4 in scan line 2.

In FIG. 11B, charged particle beam 140 is scanned pixel-by-pixel along scan line 2, positioned at locations that correspond with pixels assigned exposure dosage D1 and pixels assigned exposure dosage D4. For pixels along scan line 2 assigned exposure dosage D1 (in other words, dark pixels 335), charged particle beam system 100 blanks charged particle beam 140 without deflection to expose these pixels on workpiece 102, such that these pixels receive exposure dosage D1. For pixels along scan line 2 assigned exposure dosage D4 (in other words, bright edge pixels 345), charged particle beam system 100 un-blanks charged particle beam 140 without deflection to expose these pixels on workpiece 102, such that these pixels receive another unit of exposure dosage, reaching exposure dosage D3. By robbing exposure energy from neighboring pixels assigned exposure dosage D1, charged particle beam system 100 doubles exposure time (and exposure energy) received by pixels assigned exposure dosage D4 upon exposing workpiece 102 along scan line 1 and scan line 2.

Figure 11C:
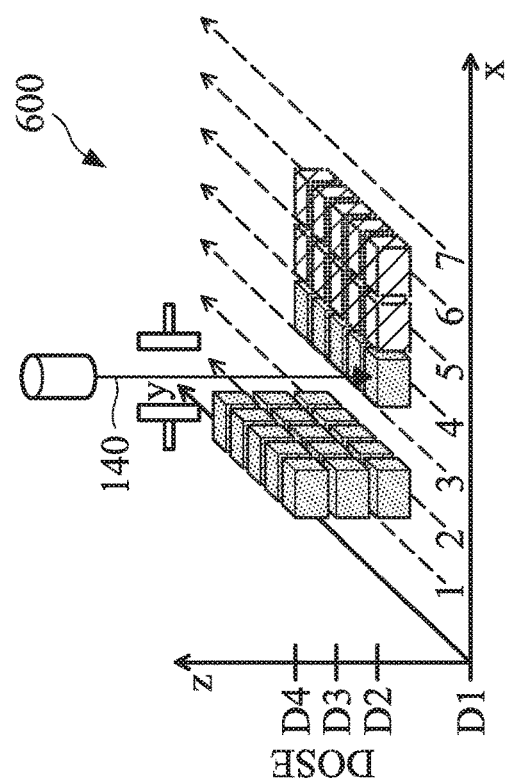

In FIG. 11C, charged particle beam 140 is scanned pixel-by-pixel along scan line 3, positioned at locations that correspond with pixels assigned exposure dosage D1. For pixels along scan line 1 that do not neighbor pixels assigned exposure dosage D4 (in other words, dark pixels 335), charged particle beam system 100 blanks charged particle beam 140 without deflection to expose these pixels on workpiece 102, such that these pixels receive exposure dosage D1. For pixels along scan line 3 that neighbor pixels assigned exposure dosage D4 (in other words, neighboring dark edge pixels 350), charged particle beam system 100 un-blanks and deflects charged particle beam 140 to expose these pixels on workpiece 102, such that these pixels receive exposure dosage D1 and pixels assigned exposure dosage D4 (in other words, bright edge pixels 345) receive another unit of exposure dosage, reaching exposure dosage D4. In such implementations, charged particle beam system 100 deflects charged particle beam 140 in a direction perpendicular to the scan direction. For example, in the depicted embodiment, charged particle beam 140 is scanned in the y-direction, and charged particle beam system 100 deflects charged particle beam 140 in the x-direction (here, left) one pixel to cross a boundary between pixels assigned exposure dosage D1 and pixels assigned exposure dosage D4. By robbing exposure energy from a column of pixels in scan line 3 adjacent to the column of pixels assigned exposure dosage D4 in scan line 2, charged particle beam system 100 triples exposure time (and exposure energy) received by pixels assigned exposure dosage D4 upon exposing workpiece 102 along scan line 1, scan line 2, and scan line 3.

Figure 11D:
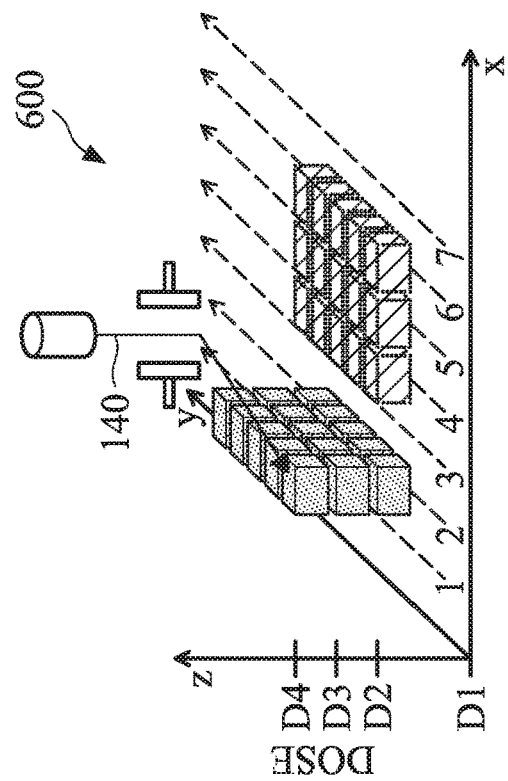

In FIG. 11D, charged particle beam 140 is scanned pixel-by-pixel along scan line 4, positioned at locations that correspond with pixels assigned exposure dosage D1 and pixels assigned exposure dosage D2. For pixels along scan line 4 assigned exposure dosage D1 (in other words, dark pixels 335), charged particle beam system 100 blanks charged particle beam 140 without deflection to expose these pixels on workpiece 102, such that these pixels receive exposure dosage D1. For pixels along scan line 4 assigned exposure dosage D2 (in other words, bright pixels 340), charged particle beam system 100 un-blanks charged particle beam 140 without deflection to expose these pixels on workpiece 102, such that these pixels receive exposure dosage D2. Though not depicted, charged particle beam system 100 continues scanning workpiece 102 along scan line 5, scan line 6, and scan line 7 until the target pattern defined by dosage profile 600 is formed on workpiece 102.

Figure 12A:
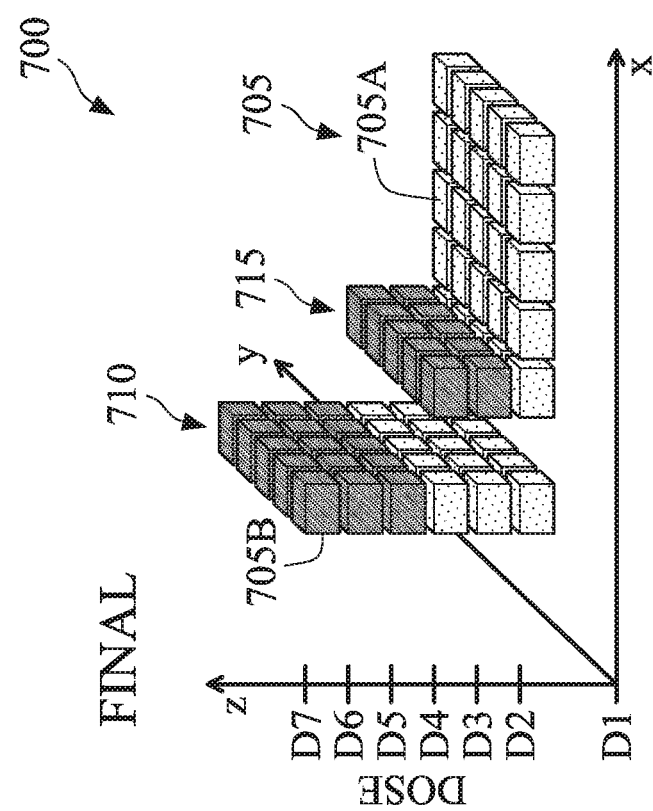
FIG. 12A schematically depicts a final dosage profile, which includes multiple exposure dosages, achieved when a lithography system performs multiple passes according to various aspects of the present disclosure.
Figure 12B:
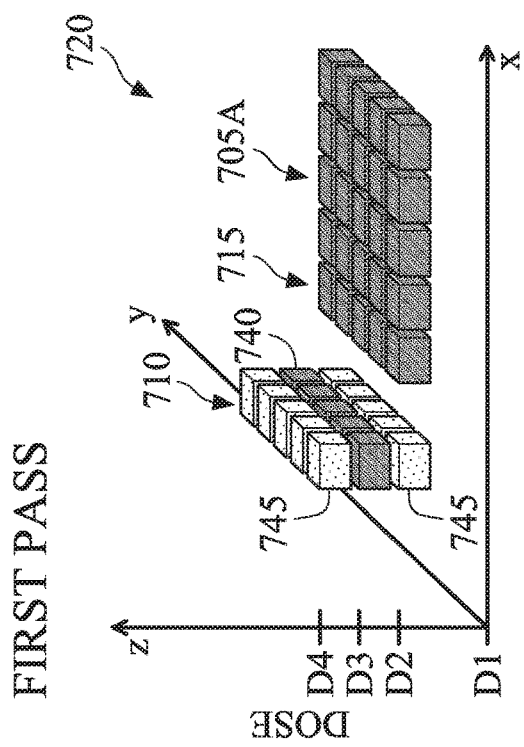
FIG. 12B schematically depicts a first pass dosage profile, which defines various exposure dosages defined by a portion of the final dosage profile of FIG. 12A, according to various aspects of the present disclosure.
Figure 12C:
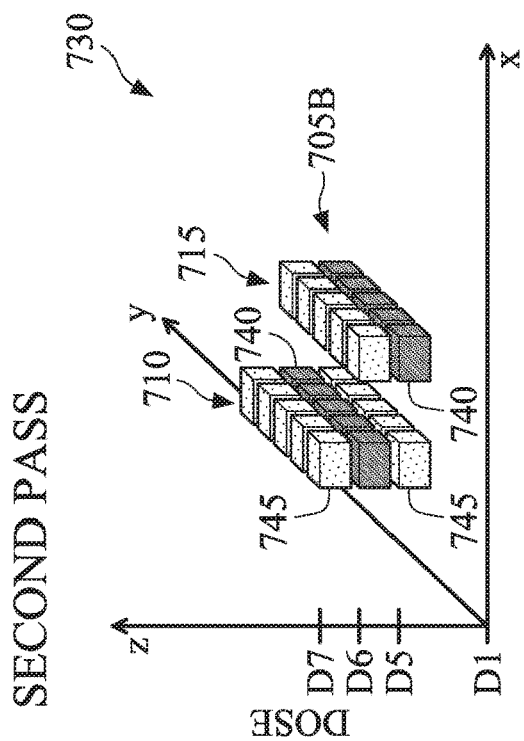
FIG. 12C schematically depicts a second pass dosage profile, which defines various exposure dosages defined by a portion of the final dosage profile of FIG. 12A, according to various aspects of the present disclosure.

Turning to FIGS. 12A-12C, charged particle beam system 100 can implement the image contrast enhancement techniques described above with a multi-pass writing scheme to further enhance image contrast. In some implementations, charged particle beam system 100 can perform a first pass (scan) on workpiece 102 and a second pass (scan) on workpiece 102, which combine to form a target pattern defined by an IC design layout thereon. FIG. 12A schematically depicts a final dosage profile 700, which includes multiple exposure dosages, achieved when charged particle beam system 100 performs multiple passes according to various aspects of the present disclosure. Dosage profile 700 defines exposure dosages for pixels of an exposure map, where a horizontal plane defined by an x-axis and a y-axis identifies a location of each pixel (such as an x-coordinate and a y-coordinate) and a vertical axis identifies an exposure dosage for each identified pixel. Each pixel corresponds with a number of exposure blocks 705, where each exposure block 705 represents a unit of exposure dose. In dosage profile 700, pixels are assigned exposure dosage D1, exposure dosage D2, exposure dosage D3, exposure dosage D4, exposure dosage D5, exposure dosage D6, or exposure dosage D7. Exposure dosage D7 is greater than exposure dosage D6, exposure dosage D6 is greater than exposure dosage D5, and exposure dosage D5 is greater than exposure dosage D4, exposure dosage D4 is greater than exposure dosage D3, exposure dosage D3 is greater than exposure dosage D2, and exposure dosage D2 is greater than exposure dosage D1. The assigned exposure dosages define edge portions of the target pattern. For example, in the depicted embodiment, an edge 710 is defined by pixels assigned exposure dosage D7 (each pixel assigned exposure dosage D7 representing an edge portion of edge 710), and an edge 715 is defined by pixels assigned exposure dosage D4 (each pixel assigned exposure dosage D4 representing an edge portion of edge 715).

To achieve exposure dosages D1-D7, charged particle beam system 100 can divide dosage profile 700 into more than one dosage profile, where charged particle beam system 100 scans workpiece 102 according to each dosage profile to form the target pattern as defined by dosage profile 700 on workpiece 102. For example, in the depicted embodiment, dosage profile 700 divides exposure blocks 705 into first pass exposure blocks 705A and second pass exposure blocks 705B, where charged particle beam system 100 performs a scan according to a dosage profile defined by first pass exposure blocks 705A and a second scan according to a dosage profile defined by second pass exposure blocks 705B. FIG. 12B schematically depicts a first pass dosage profile 720, which defines various exposure dosages defined by first pass exposure blocks 705A, according to various aspects of the present disclosure; and FIG. 12C schematically depicts a second pass dosage profile 730, which defines various exposure dosages defined by second pass exposure blocks 705B, according to various aspects of the present disclosure. In dosage profile 720 and dosage profile 730, exposure blocks 705A and exposure blocks 705B are further classified as exposure blocks 740 and exposure blocks 745. Exposure blocks 740 direct charged particle beam system 100 to un-blank charged particle beam 140 without deflection when positioned at locations corresponding with pixels defining edge 710 and edge 715, as described in detail above. Exposure blocks 745 direct charged particle beam system 100 to un-blank and deflect charged particle beam 140 from pixels assigned exposure dosage D1 to pixels defining edge 710 and edge 715, as described in detail above. In some implementations, based on dosage profile 720 and dosage profile 730, charged particle beam system 100 can re-assign exposure energy on-the-fly, selecting dark pixels (here, pixels assigned exposure dosage D1) from which exposure energy is assigned to pixels defining edge 710 and edge 715 as charged particle beam 100 scans workpiece 102. In some implementations, charged particle beam 100 re-assigns exposure energy from dark pixels (here, pixels assigned exposure dosage D1) before beginning the first scan and the second scan of workpiece 102. By combining multiple scans with the image contrast enhancement techniques described herein, charged particle beam system 100 can further enhance image contrast.

The present disclosure provides for various embodiments. Lithography systems and lithography methods are disclosed herein for enhancing lithography printability, and in particular, for enhancing image contrast. Though the present disclosure describes the image contrast enhancement techniques with reference to a charged particle beam system, the present disclosure also contemplates implementing the image contrast enhancement techniques described herein by any lithography system operating in a raster mode. As one non-limiting example, the image contrast enhancement techniques can be implemented by a laser beam lithography system operating in raster mode, where the laser beam lithography system generates a laser beam (also referred to as an energy beam) to write a pattern, such as an IC pattern, on a workpiece. In such implementations, the laser beam lithography system can include a grid deflection system, such as a surface acoustic wave (SAW) device, configured to deflect the laser beam across at least one pixel of an exposure grid, allowing the laser beam lithography system to relocate a landing position of the laser beam on the workpiece.

An exemplary method includes receiving an integrated circuit (IC) design layout and generating an exposure map based on the IC design layout. The IC design layout includes a target pattern to be formed on a workpiece, and the exposure map includes an exposure grid divided into dark pixels and bright pixels that combine to form the target pattern. The method further includes adjusting the exposure map to increase exposure dosage at edges of the target pattern. In some implementations, the adjusting includes locating an edge portion of the target pattern in the exposure map, where the edge portion has a corresponding bright pixel, and assigning exposure energy from at least one dark pixel to the corresponding bright pixel, thereby generating a modified exposure map. In some implementations, the method further includes performing a lithography process, such as an electron-beam lithography process, using the adjusted exposure map. In some implementations, the exposure map and the modified exposure map are used for raster scanning the workpiece to form the target pattern thereon.

In some implementations, generating the exposure map includes assigning dark pixels an ON blanking instruction and assigning bright pixels an OFF blanking instruction. The ON blanking instruction directs a lithography system to blank an energy beam, and the OFF blanking instruction directs a lithography system to un-blank the energy beam. In such implementations, assigning the exposure energy from the at least one dark pixel to the bright pixel can include changing the ON blanking instruction assigned to the at least one dark pixel to an OFF blanking instruction and assigning the at least one dark pixel an ON grid deflecting instruction. The ON grid deflecting instruction directs the lithography system to deflect the energy beam across at least one pixel in the exposure grid. In some implementations, locating the edge portion includes identifying a transition between an ON blanking instruction and an OFF blanking instruction.

In some implementations, the edge portion has a corresponding dark pixel, and the assigning include assigning exposure energy from the corresponding dark pixel to the corresponding bright pixel. In some implementations, the corresponding dark pixel is positioned before or after the corresponding bright pixel along a scan direction. In some implementations, the generating the modified exposure map includes generating lithography writing instructions for the dark pixels, the bright pixels, and the corresponding bright pixel. In such implementations, when implemented, the lithography writing instructions achieve a first exposure dosage for the dark pixels, a second exposure dosage for the bright pixels, and a third exposure dosage for the corresponding bright pixel with a single scan across a workpiece. The second exposure dosage is greater than the first exposure dosage, and the third exposure dosage is greater than the second exposure dosage.

An exemplary method for writing an integrated circuit (IC) pattern on a workpiece includes generating an energy beam and exposing the workpiece to the energy beam based on an exposure layout. The exposure layout includes dark pixels and bright pixels that define the IC pattern. The exposing includes positioning the energy beam at a location corresponding with a dark pixel of the exposure layout, exposing the dark pixel on the workpiece by un-blanking and deflecting the energy beam to a bright pixel, positioning the energy beam at a location corresponding with the bright pixel, and exposing the bright pixel on the workpiece by un-blanking the energy beam without deflection. The dark pixel may be adjacent to the bright pixel. In some implementations, the energy beam is deflected across at least one pixel of an exposure grid of the exposure layout.

In some implementations, the energy beam is scanned in a direction perpendicular to an edge of the IC pattern, such that the energy beam is deflected along the scan direction to the bright pixel. In some implementations, the energy beam is scanned in a direction parallel to an edge of the IC pattern, such that the energy beam is deflected perpendicular to the scan direction to the bright pixel. In some implementations, the energy beam is scanned in a direction oblique to an edge of the IC pattern, such that the energy beam is deflected at an angle from the scan direction to the bright pixel. In some implementations, the dark pixel is a first dark pixel and the bright pixel is a first bright pixel, where the first dark pixel and the second dark pixel correspond with an edge of the IC pattern. In such implementations, the exposing can further include positioning the energy beam at a location corresponding with a second dark pixel of the exposure layout, exposing the second dark pixel on the workpiece by blanking the energy beam without deflection, positioning the energy beam at a location corresponding with the second bright pixel, and exposing the second bright pixel on the workpiece by un-blanking the energy beam without deflection. In some implementations, the energy beam is a charged particle beam, such as an electron beam or an ion beam. In some implementations, the energy beam is a laser beam.

An exemplary lithography system can include a lithography data processing module and a lithography exposure module in communication with the lithography data processing module. The lithography data processing module generates an exposure map for a target pattern defined by an integrated circuit (IC) design layout. The exposure map includes an exposure grid divided into dark pixels and bright pixels that combine to form the target pattern. The lithography data processing module adjusts the exposure map by assigning exposure energy from dark pixels to bright pixels that correspond with edges of the target pattern. The lithography exposure module generates an energy beam, such as a charged particle beam, for writing the target pattern on a workpiece based on the adjusted exposure map. In some implementations, the lithography exposure module includes a blanking system for blanking the energy beam and a grid deflection system for deflecting the energy beam across at least one pixel of the exposure grid. In some implementations, for a bright pixel that corresponds with an edge of the target pattern, the lithography exposure module un-blanks and deflects the energy beam to the bright pixel when exposing a dark pixel. It is noted that communicative coupling includes any electrical coupling means, mechanical coupling means, other coupling means, or a combination thereof that facilitates connection and communication between lithography data processing module with the various components of the lithography exposure module.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for improving image contrast achieved by a lithography process, the method comprising:
   receiving an integrated circuit (IC) design layout, wherein the IC design layout includes a target pattern to be formed on a workpiece;
   generating an exposure map based on the IC design layout, wherein the exposure map includes an exposure grid divided into dark pixels and bright pixels that combine to form the target pattern; and
   adjusting the exposure map to increase exposure dosage at edges of the target pattern, wherein the adjusting includes:
   locating an edge portion of the target pattern in the exposure map, wherein the edge portion has a corresponding bright pixel, and
   assigning exposure energy from at least one dark pixel to the corresponding bright pixel, thereby generating a modified exposure map.

2. The method of claim 1, wherein the assigning the exposure energy from the at least one dark pixel to the corresponding bright pixel includes:
   changing an ON blanking instruction assigned to the at least one dark pixel to an OFF blanking instruction, wherein the ON blanking instruction directs a lithography system to blank an energy beam; and
   assigning the at least one dark pixel an ON grid deflecting instruction, wherein the ON grid deflecting instruction directs the lithography system to deflect the energy beam across at least one pixel in the exposure grid.

3. The method of claim 1, wherein the locating the edge portion includes identifying a transition between an ON blanking instruction and an OFF blanking instruction.

4. The method of claim 1, wherein the edge portion has a corresponding dark pixel, and the assigning include assigning exposure energy from the corresponding dark pixel to the corresponding bright pixel.

5. The method of claim 4, wherein the corresponding dark pixel is positioned before or after the corresponding bright pixel along a scan direction.

6. The method of claim 1, wherein the generating the modified exposure map includes generating lithography writing instructions for the dark pixels, the bright pixels, and the corresponding bright pixel, such that when implemented, the lithography writing instructions achieve a first exposure dosage for the dark pixels, a second exposure dosage for the bright pixels, and a third exposure dosage for the corresponding bright pixel with a single scan across a workpiece, wherein the second exposure dosage is greater than the first exposure dosage and the third exposure dosage is greater than the second exposure dosage.

7. The method of claim 1, wherein the exposure map and the modified exposure map are used for raster scanning the workpiece to form the target pattern thereon.

8. The method of claim 1, further comprising performing a lithography process using the adjusted exposure map.

9. The method of claim 8, wherein the lithography process is an electron-beam lithography process.

10. A method for writing an integrated circuit (IC) pattern with improved image contrast on a workpiece, the method comprising:
    generating an energy beam; and exposing the workpiece to the energy beam based on an exposure layout, wherein the exposure layout includes dark pixels and bright pixels that define the IC pattern, and further wherein the exposing includes:
  positioning the energy beam at a location corresponding with a dark pixel of the exposure layout,
  exposing the dark pixel on the workpiece by un-blanking and deflecting the energy beam to a bright pixel,
  positioning the energy beam at a location corresponding with the bright pixel, and
  exposing the bright pixel on the workpiece by un-blanking the energy beam without deflection.

11. The method of claim 10, wherein the energy beam is deflected across at least one pixel of an exposure grid of the exposure layout.

12. The method of claim 10, wherein the energy beam is scanned in a direction perpendicular to an edge of the IC pattern, such that the energy beam is deflected along the scan direction to the bright pixel.

13. The method of claim 10, wherein the energy beam is scanned in a direction parallel to an edge of the IC pattern, such that the energy beam is deflected perpendicular to the scan direction to the bright pixel.

14. The method of claim 10, wherein the energy beam is scanned in a direction oblique to an edge of the IC pattern, such that the energy beam is deflected at an angle from the scan direction to the bright pixel.

15. The method of claim 10, wherein the dark pixel is adjacent to the bright pixel.

16. The method of claim 10, wherein the dark pixel is a first dark pixel and the bright pixel is a first bright pixel, the first dark pixel and the first bright pixel corresponding with an edge of the IC pattern, wherein the exposing further includes:
  positioning the energy beam at a location corresponding with a second dark pixel of the exposure layout;
  exposing the second dark pixel on the workpiece by blanking the energy beam without deflection;
  positioning the energy beam at a location corresponding with a second bright pixel; and
  exposing the second bright pixel on the workpiece by un-blanking the energy beam without deflection.

17. The method of claim 10, wherein the generating the energy beam includes generating a charged particle beam.

18. A method comprising:
  positioning an electron beam at a first location of an integrated circuit (IC) wafer that corresponds with a first pixel;
  un-blanking and deflecting the electron beam at the first location to a second pixel of the IC wafer adjacent to the first pixel, such that the second pixel receives a first exposure dosage;
  positioning the electron beam at a second location of the IC wafer that corresponds with the second pixel; and
  un-blanking the electron beam without deflection at the second location to the second pixel, such that the second pixel receives a second exposure dosage.

19. The method of claim 18, wherein the second pixel corresponds with an edge portion of an IC pattern formed on the IC wafer.

20. The method of claim 18, further comprising generating an exposure map that includes blanking instructions and grid deflection instructions for the first pixel and the second pixel.

* * * * *